United States Patent
Sakamoto et al.

(10) Patent No.: US 6,646,331 B2
(45) Date of Patent: Nov. 11, 2003

(54) SEMICONDUCTOR DEVICE AND SEMICONDUCTOR MODULE

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 281 days.

(21) Appl. No.: 09/809,857

(22) Filed: Mar. 16, 2001

(65) Prior Publication Data

US 2002/0053722 A1 May 9, 2002

(30) Foreign Application Priority Data

Oct. 5, 2000 (JP) ..................................... P. 2000-306670

(51) Int. Cl.$^7$ .......................... H01L 23/02; H01L 23/10; H01L 23/28
(52) U.S. Cl. ..................... 257/678; 257/706; 257/675; 257/796
(58) Field of Search ............................... 257/706, 675, 257/796, 678

(56) References Cited

U.S. PATENT DOCUMENTS

| 5,543,663 A | * | 8/1996 | Takubo ....................... 257/720 |
| 5,869,894 A | * | 2/1999 | Degani et al. ............... 257/723 |
| 6,404,049 B1 | * | 6/2002 | Shibamoto et al. ......... 257/712 |

OTHER PUBLICATIONS

Nikki Electronics; No. 691 Jun. 16, 1997, pp. 92–120.

* cited by examiner

*Primary Examiner*—Amir Zarabian
*Assistant Examiner*—Kiesha Rose
(74) *Attorney, Agent, or Firm*—Fish & Richardson P.C.

(57) ABSTRACT

A heat radiation electrode (15) is exposed from the back surface of an insulating resin (13), and a metal plate (23) is affixed to this heat radiation electrode (15). The back surface of this metal plate (23) and the back surface of a flexible sheet become substantially within a same plane, so that it is readily affixed to a second supporting member (24). In addition, the top surface of the heat radiation electrode (15) is made protrusive beyond the top surfaces of the pads (14) to reduce the distance between the semiconductor chip (16) and the heat radiation electrode (15). Accordingly, the heat generated by the semiconductor chip can be efficiently dissipated via the heat radiation electrode (15), the metal plate (23) and the second supporting member (24).

34 Claims, 13 Drawing Sheets

ACP/F Process

SBB Process

ESC Process

NCP Process

GGI Process

SolderBump Process

SEMICONDUCTOR DEVICE AND SEMICONDUCTOR MODULE

BACKGROUND OF THE INVENTION

The present invention relates to a semiconductor device, a semiconductor module and a hard disk, and especially to a structure capable of efficiently dissipating heat from a semiconductor chip.

Due to the recent growth of the use of semiconductor devices in portable devices and small/densely-mounted devices, the reduction in size and weight and the improvement in heat dissipation properties are demanded at the same time. In addition, semiconductor devices are mounted on various types of substrates, which, in turn, are mounted in various many systems as semiconductor modules. As for such a substrate, the use of a ceramic substrate, a printed board, a flexible sheet, a metal substrate or a glass substrate etc. may be contemplated, and the following description gives one example thereof. Here, the semiconductor module is explained as being mounted on a flexible sheet.

FIG. 17 shows an example in which a semiconductor module using a flexible sheet is mounted in a hard disk 100. This hard disk 100 may be, for example, the one described in detail in an article of Nikkei Electronics (No. 691, Jun. 16, 1997, p.92-).

This hard disk 100 is accommodated within a casing 101 made of a metal, and comprises a plurality of recording disks 102 that are integrally attached to a spindle motor 103. Over the surfaces of individual recording disks 102, magnetic heads 104 are respectively disposed each with a very small clearance. These magnetic heads 104 are attached at the tips of suspensions 106 which are affixed to the ends of respective arms 105. A magnetic head 104, a suspension 106 and an arm 105 together form one integral body and this integral body is attached to an actuator 107.

the magnetic heads 104 must be electrically connected with a read/write amplifying IC 108 in order to perform read and write operations. Accordingly, a semiconductor module comprising this read/write amplifying IC 108 mounted on a flexible sheet 109 is used, and the wirings provided on this flexible sheet 109 are electrically connected, ultimately, to the magnetic heads 104. This semiconductor module 110 is called "flexible circuit assembly", typically abbreviated as "FCA".

From the back surface of the casing 101, connectors 111 provided on the semiconductor module 110 are exposed, and these connector (male or female) 111 and connectors (female or male) attached on a main board 112 are engaged. On this main board 112, wirings are provided, and driving ICs for the spindle motor 103, a buffer memory and other ICs for a driving, such as ASIC, are mounted.

The recording disk 102 spins at, for example, 4500 rpm via the spindle motor 103, and the actuator 107 detects the position of the magnetic head 104. Since this spinning mechanism is enclosed by a cover provided over the casing 101, there is no way to completely prevent the accumulation of heat, resulting in the temperature rise in the read/write amplifying IC 108. Therefore, the read/write amplifying IC 108 is attached to the actuator 107 or the casing 101 etc. at a location having a better heat conduction property than elsewhere. Further, since revolutions of the spindle motor 103 tend to high speed such as 5400, 7200 and 10000 rpm, this heat dissipation has more importance.

In order to provide further detail of the FCA explained above, the structure thereof is shown in FIG. 18. FIG. 18A is the plan view, and FIG. 18B is a cross-sectional view taken along the line A—A which cuts across the read/write amplifying IC 108 provided on one end of the module. This FCA 110 is attached to an internal portion of the casing 101 in a folded-state, so that it employs a first flexible sheet 109 have a two-dimensional shape that can easily be folded.

On the left end of this FCA 110, the connectors 111 are attached, forming a first connection section 120. First wirings 121 electrically connected to these connectors 111 are adhered on the first flexible sheet 109, and they extend all the way to the right end. The first wirings 121 are then electrically connected to the read/write amplifying IC 108. Leads 122 of the read/write amplifying IC 108 to be connected to the magnetic heads 104 are connected with second wirings 123 which, in turn, are electrically connected to third wirings 126 on a second flexible sheet 124 provided over the arm 105 and suspension 106. That is, the right end of the first flexible sheet 109 forms a second connection section 127 at which the first flexible sheet 109 is connected to the second flexible sheet 124. Alternatively, the first flexible sheet 109 and the second flexible sheet 124 may be integrally formed. In this case, the second wirings 123 and the third wirings 126 are provided integrally.

On the back surface of the first flexible sheet 109 on which the read/write amplifying IC 108 is to be provided, a supporting member 128 is disposed. As for this supporting member 128, a ceramic substrate or an Al substrate may be used. The read/write amplifying IC 108 is thermally coupled with a metal that is exposed to inside of the casing 101 through this supporting member 128, so that the heat generated in the read/write amplifying IC 108 can be externally released.

With reference to FIG. 18B, a connecting structure between the read/write amplifying IC 108 and the first flexible sheet 109 will now be explained.

This flexible sheet 109 is constituted by laminating, from the bottom, a first polyimide sheet 130 (first PI sheet), a first adhesion layer 131, a conductive pattern 132, a second adhesion layer 133 and a second polyimide sheet 134 (second PI sheet), so that the conductive pattern 132 is sandwiched between the first and second PI sheets 130 and 134.

In order to connect the read/write amplifying IC 108, a portion of the second PI sheet 134 and the second adhesion layer 133 are eliminated at the connection section to form an opening 135 which exposes the conductive pattern 132. The read/write amplifying IC 108 is electrically connected thereto through leads 122 as shown in the figure.

The semiconductor device packaged by an insulating resin 136 as shown in FIG. 18B has heat dissipating paths indicated by arrows for externally dissipating its heat. Especially, since the insulating resin 136 gives the thermal resistance, the semiconductor device has a structure that the heat generated by the read/write amplifying IC 108 cannot be efficiently dissipated to the outside the device.

Further details will now be explained using this example in hard disk application. As for the read/write transfer rate of a hard disk, a frequency of 500 MHz to 1 GHz, or even a greater frequency, is required, so that the read/write speed of the read/write amplifying IC 108 must be fast. To this end, the paths of the wirings on the flexible sheet that are connected to the read/write amplifying IC 108 has to be shorten, and the temperature rise in the read/write amplifying IC 108 must be suppressed.

Especially, since the recording disks 102 are spinning at a high speed, and the casing 101 and the lid provide a molded space, the interior temperature would rise up to around 70 to 80° C. On the other hand, a typical allowable temperature for the operation of an IC is approximately 125° C. This means that, from the interior temperature of 80° C., a further temperature rise by approximately 45° C. is permissible for the read/write amplifying IC 108. However, where the thermal resistance of the semiconductor device itself and FCA is large, this allowable operation temperature can easily be exceeded, thereby disabling the device to provide its actual performance level. Accordingly, a semiconductor device and FCA having superior heat dissipating properties are being demanded.

Furthermore, since the operation frequency is expected to further increase in the future, further temperature rise is also expected in the read/write amplifying IC 108 itself due to the heat generated by computing operations. At room temperature, the IC can provide the performance at its intended operation frequency, however, where it is placed inside of a hard disk, its operation frequency has to be reduced in order to restrain the temperature rise.

As described above, further heat dissipating properties of semiconductor device, semiconductor module (FCA) are demanded in connection with the increase of the operation frequency in the future.

On the other hand, the actuator 107, and the arms 105, suspensions 106 and magnetic heads 104 attached thereto has to be designed as light-weighted as possible in order to reduce the moment of inertia. Especially, where the read/write amplifying IC 108 is mounted on the surface of the actuator 107 as shown in FIG. 17, the weight reduction is demanded also for the IC 108 and FCA 110.

SUMMARY OF THE INVENTION

The present invention was invented in consideration with the above problems, and in the first aspect, it provides a semiconductor device comprising a semiconductor chip integrally molded with an insulating resin in a face-down state, the semiconductor device having exposed on the back surface thereof a pad electrically connected to a bonding electrode of the semiconductor chip and a heat radiation electrode disposed over the surface of the semiconductor chip, wherein the problem is solved by having the top surface of the heat radiation electrode protrude beyond the top surface of the pad, and practically determining the thickness of a connecting means for connecting the bonding electrode and the pad by the amount of this protrusion.

As for the means to connect the pad and the bonding electrode, an Au bump or a solder ball may be used. The Au bump may comprise at least one stage of an Au cluster, and the thickness thereof would be about 40 μm for a one-stage bump and 70–80 μm for a two-stage bump. Since the height of the heat radiation electrode surface generally matches with the height of the pad surface, the space between the semiconductor chip and the heat radiation electrode is determined by the thickness of the bump. Accordingly, the space between the semiconductor chip and the heat radiation electrode cannot be made any smaller than the thickness of the bump. However, if the surface of the heat radiation electrode is designed to protrude beyond the surface of the pad by the substantial thickness of the bump, the space may be made smaller.

The thickness of a solder bump or a solder ball is approximately 50 to 70 μm, and in this case also, the space may be made small according to the same principle. A brazing material such as solder has a good wettability with the pad, so that when it is in a molten state, it spreads out over the surface of the pad, resulting in a smaller thickness. However, since the gap between the bonding electrode and the pad is determined by the amount of protrusion of the heat radiation electrode, the thickness of the brazing material is determined by this amount of the protrusion. Accordingly, by the amount the brazing material can be made thicker, then the stress applied to the solder bump may be more distributed, so that the deterioration due to heat cycles can be minimized.

In the second aspect, the problem is solved by using an Au bump or a bump of a brazing material such as solder or a solder ball as the connecting means.

In the third aspect, the problem is solved by providing a metal plate on the exposed portion of the heat radiation electrode in a manner so that it protrudes beyond the back surface of the pad.

This protrusive metal plate and the back surface of a flexible sheet which serves as a first supporting member may be made within a same plane, so that a structure is provided, in which the metal plate can be adhered or abutted to the interior of a casing, especially to a member of the casing having a flat surface such as a heat sink plate etc.

In the fourth aspect, the problem is solved by disposing the back surface of the pad and the back surface of the heat radiation electrode substantially within a same plane.

In the fifth aspect, the problem is solved by affixing the semiconductor chip and the heat radiation electrode together by an insulating material.

In the sixth aspect, the problem is solved by affixing the heat radiation electrode and the metal plate together by an insulating material or a conductive material.

In the seventh aspect, the problem is solved by integrally forming the heat radiation electrode and the metal plate from a same material.

In the eighth aspect, the problem is solved by having the back surface of the insulating resin protrude beyond the back surface of the pad.

When forming a brazing material such as solder over the back surface of the pad, the thickness of the solder may be determined by the amount of this protrusion. It also prevents short-circuiting with the conductive pattern extending over the back surface of the semiconductor device.

In the ninth aspect, the problem is solved by having the side surfaces of the pad and the back surface of the insulating resin that extends from the side surfaces of the pad define a same curved surface.

The insulating resin exposed from the back surface of the semiconductor device would define a curved surface when etched, and would exhibit a shape which provides a point contact rather than a face contact. Accordingly, the frictional resistance of the back surface of the semiconductor device is reduced, there by facilitating self-alignment. It also provides a relief for the brazing material which is more effective comparing to a structure in which the protrusive feature of the back surface of the insulating resin is flat. In this way the short-circuiting between the adjacent bumps of the brazing material maybe avoided.

In the tenth aspect, a semiconductor module is provided, which comprises a first supporting member having a conductive pattern provided thereon and a semiconductor device comprising a semiconductor chip which is electrically connected to the conductive pattern and is integrally molded by an insulating resin in a face-down state, the semiconductor device having exposed on the back surface thereof, a pad electrically connected to a bonding electrode of the semiconductor chip and a heat radiation electrode disposed over the surface of the semiconductor chip, wherein the problem is solved by having the top surface of the heat radiation electrode protrude beyond the top surface of the pad, and determining the thickness of a connecting means for connecting the bonding electrode and the pad according to the amount of this protrusion, an by electrically connecting the pad to the conductive pattern provided on the first supporting member, and providing an opening to the first supporting member at a location which corresponds to the heat radiation electrode, the opening accommodating a metal plate which is affixed to the heat radiation electrode.

The distance between the semiconductor chip and the heat radiation electrode can be set so as to assure the conduction of heat, and at the same time, the metal plate thermally coupled with the heat radiation electrode can be abutted to a heat-dissipating substrate provided under the first supporting member.

In the eleventh aspect, the problem is solved by adhering a second supporting member having the metal plate affixed thereto to the back surface of the first supporting member, and affixing this metal plate and the heat radiation electrode together.

In the twelfth aspect, the problem is solved by forming the heat radiation electrode and the metal plate integrally from a same material.

As shown in FIGS. 13 and 14, the metal plate and the heat radiation electrode may be formed integrally by etching a conductive foil, thereby unnecessitating the step for affixing the metal plate.

In the thirteenth aspect, the problem is solved by providing a fixation plate made of a conductive material over the second supporting member at a location which corresponds to the metal plate, and by thermally coupling the fixation plate and the metal plate.

In the fourteenth aspect, the problem is solved by forming, respectively, the metal plate mainly by Cu, the second supporting member mainly by Al, and the fixation plate by a plated film mainly made of Cu formed on the second supporting member.

In this way, the thermal resistance between the second supporting member and the fixation plate may substantially be reduced, so that the temperature rise in the semiconductor chip may be effectively prevented.

In the fifteenth aspect, the problem is solved by having the back surface of the insulating resin protrude beyond the back surface of the pad.

In the sixteenth aspect, the problem is solved by having the side surfaces of the pad and the back surface of the insulating resin which extends from the side surfaces of the pad define the same curved surface.

In the seventeenth aspect, the problem is solved by using the semiconductor chip as a read/write amplifying IC for a hard disk.

In the eighteenth aspect, a semiconductor device is provided, which comprises a semiconductor chip integrally molded by an insulating resin in a face-down state, the semiconductor device having exposed on the back surface thereof, a pad electrically connected to a bonding electrode of the semiconductor chip, an external electrode extending via a wiring integral with the pad, and a heat radiation electrode disposed on the surface of the semiconductor chip, wherein the problem is solved by having the top surface of the heat radiation electrode protrude beyond the top surface of the pad, and determining the thickness of a connecting means for connecting the bonding electrode and the pad practically by the amount of this protrusion.

In the nineteenth aspect, the problem is solved by using an Au bump or a bump made of a brazing material such as solder, or a solder ball.

In the twentieth aspect, the problem is solved by disposing a metal plate over the exposed portion of the heat radiation electrode in a manner so that it protrudes beyond the back surface of the external connection electrode.

In the twenty-first aspect, the problem is solved by disposing the back surface of the external connection electrode and the back surface of the heat radiation electrode substantially within a same plane.

In the twenty-second aspect, the problem is solved by affixing the heat radiation electrode and the metal plate together by an insulating material.

In the twenty-third aspect, the problem is solved by affixing the heat radiation electrode and the metal plate together by an insulating material or a conductive material.

In the twenty-fourth aspect, the problem is solved by integrally forming the heat radiation electrode and the metal plate from a same material.

In the twenty-fifth aspect, the problem is solved by having the back surface of the insulating resin protrude beyond the back surface of the external connection electrode.

In the twenty-sixth aspect, the problem is solved by having the side surfaces of the external connection electrode and the back surface of the insulating material which extends from the side surfaces of the external connection electrode define a same curved surface.

In the twenty-seventh aspect, a semiconductor module is provided, which comprises a first supporting member having a conductive pattern provided thereon, and a semiconductor device including a semiconductor chip which is electrically connected to the conductive pattern and is integrally molded by an insulating resin in a face-down state, the semiconductor device having exposed on the back surface thereof, a pad electrically connected to a bonding electrode of the semiconductor chip, an external connection electrode provided via a wiring integral with the pad and a heat radiation electrode disposed over the surface of the semiconductor chip, wherein the problem is solved by having the top surface of the heat radiation electrode protrude beyond the top surface of the pad, and determining the thickness of a connecting means for connecting the bonding electrode and the pad practically by the amount of this protrusion, and by electrically connecting the conductive pattern provided on the first supporting member and the external connection electrode, and providing an opening in the first supporting member at a location corresponding to the heat radiation electrode, the opening accommodating a metal plate affixed to the heat radiation electrode.

In the twenty-eighth aspect, the problem is solved by adhering a second supporting member having the metal plate affixed thereto onto the back surface of the first supporting member.

In the twenty-ninth aspect, the problem is solved by integrally forming the heat radiation electrode and the metal plate from a same material.

In the thirtieth aspect, the problem is solved by providing a fixation plate made of a conductive material on the second supporting member at a location corresponding to the metal plate, and by thermally coupling the fixation plate and the metal plate.

In the thirty-first aspect, the problem is solved by forming, respectively, the metal plate mainly by Cu, the second supporting member mainly by Al and the fixation plate by a plated film mainly made of Cu formed on the second supporting member.

In the thirty-second aspect, the problem is solved by having the back surface of the insulating adhesive means protrude beyond the back surface of the external connection electrode.

In the thirty-third aspect, the problem is solved by having the side surfaces of the external connection electrode and the insulating adhesive means extending from the side surfaces of the external connection electrode define a same curved surface.

In the thirty-fourth aspect, the problem is solved by using the semiconductor chip as a read/write amplifying IC for a hard disk.

DETAILED DESCRIPTION OF THE PREFERRED EMBODIMENTS

The present invention provides a thin and small semiconductor device having a superior heat-dissipating capability, and a semiconductor module having this semiconductor device mounted thereon, such as a semiconductor module attached on a flexible sheet (hereinafter referred to as "FCA"), thereby providing improvement in the characteristics of, for example, a hard disk.

Figure 1A:
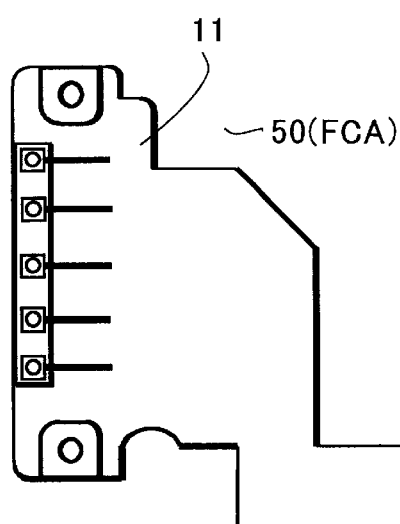
FIG. 1 is a diagram illustrating a semiconductor module according to the present invention.
Figure 16A:
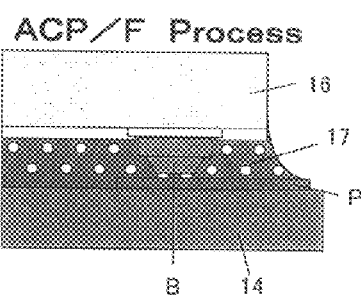
FIG. 16 shows a series of diagrams illustrating several methods for forming a connection structure of the semiconductor chip and the pads.
Figure 16B:
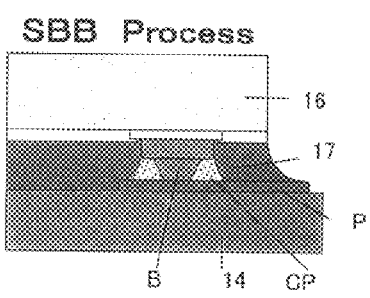
Figure 16C:
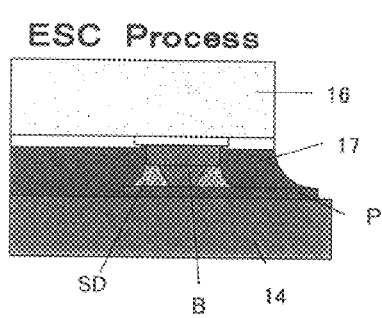
Figure 16D:
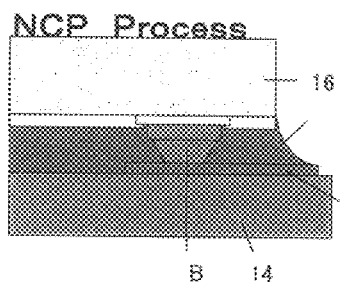
Figure 16E:
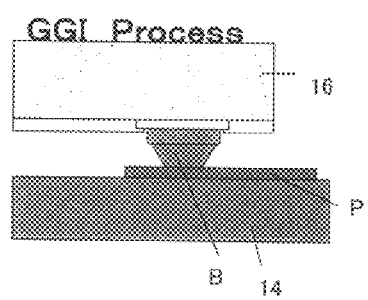
Figure 16F:
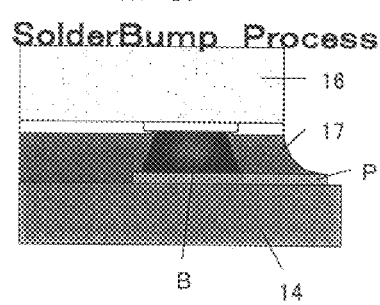
Figure 17:
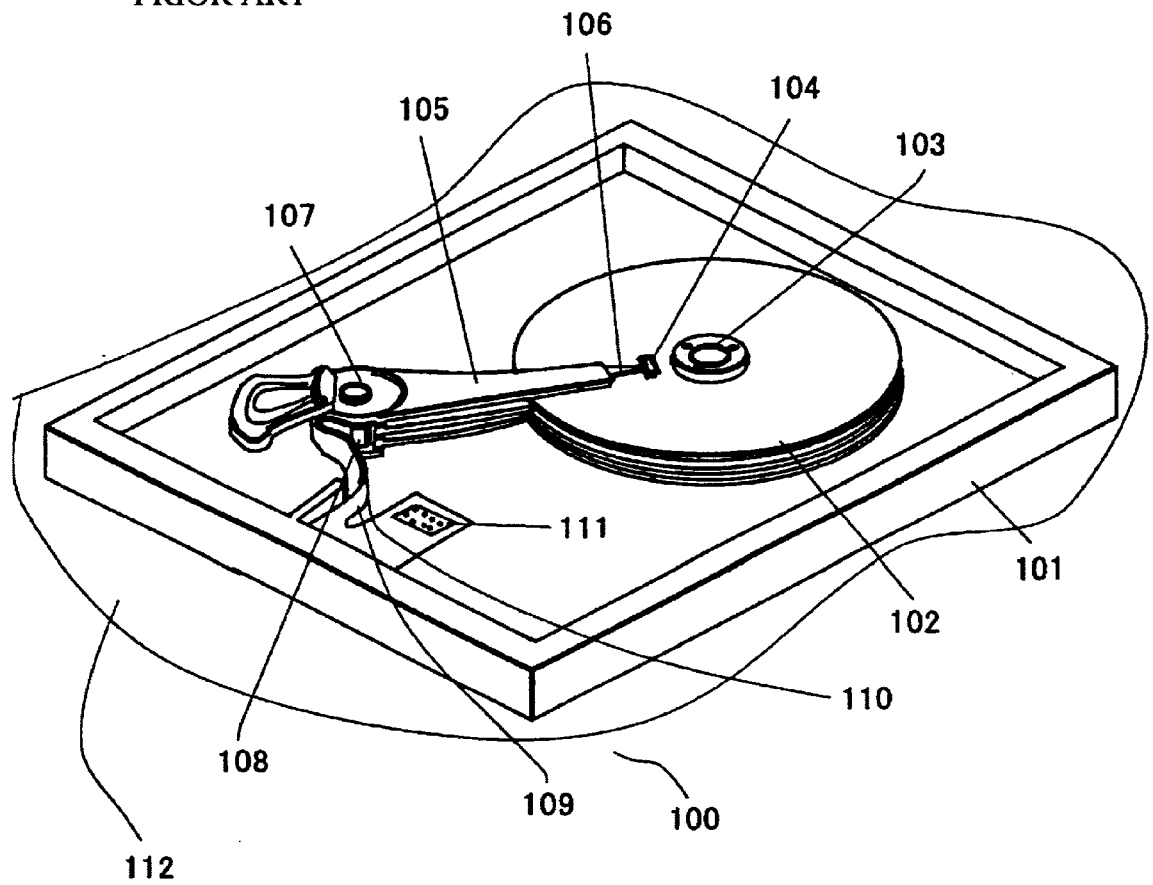
FIG. 17 is a diagram illustrating a hard disk.

First, reference shall be made to FIG. 17 illustrating an exemplary hard disk in which such an FCA is implemented, and then to FIG. 1 showing the FCA. A semiconductor device mounted on this FCA and the manufacturing method thereof are shown in FIGS. 2 through 16.

(Embodiment 1)

The first embodiment is provided to illustrate an apparatus in which the FCA is implemented. As for this apparatus, the exemplary hard disk 100 shown in FIG. 17 that has been used for illustrating the conventional art will again be used.

The hard disk 100 may be mounted on a main board 112 as necessary in order to place it in a computer etc. This main board 112 includes female (or male) connectors. Male (or female) connectors 111 provided on the FCA and exposed from the back surface of the casing 101 are connected with these connectors on the main board 112. Within the casing 101, a plurality of recording disks 102 used as a recording medium are provided in a number corresponding to the storage capacity of the hard disk. Since each of the magnetic heads 104 floats and scans over each of the recording disks 102 at a position approximately 20 nm to 30 nm away from the disk, the interval between the recording disks 102 are designed so as to allow this scanning to be undisturbed. The disks are attached to a spindle motor 103 at this interval. This spindle motor 103 is mounted on a mounting board, and a connector arranged on the back surface of this mounting board is exposed from the back surface of the casing 101. This connector is connected to a connector of the main board. Accordingly, mounted on this main board 112 are, an IC for driving the read/write amplifying IC 108 for the magnetic heads 104, an IC for driving the spindle motor 103, an IC for driving an actuator, a buffer memory for temporarily storing data, and other ASICs etc. for implementing the manufacturer's own driving scheme. Of cause, any additional active and passive elements may also be mounted.

Figure 1C:
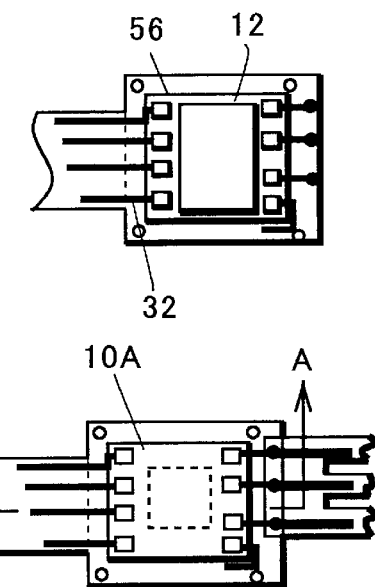
Figure 1B:
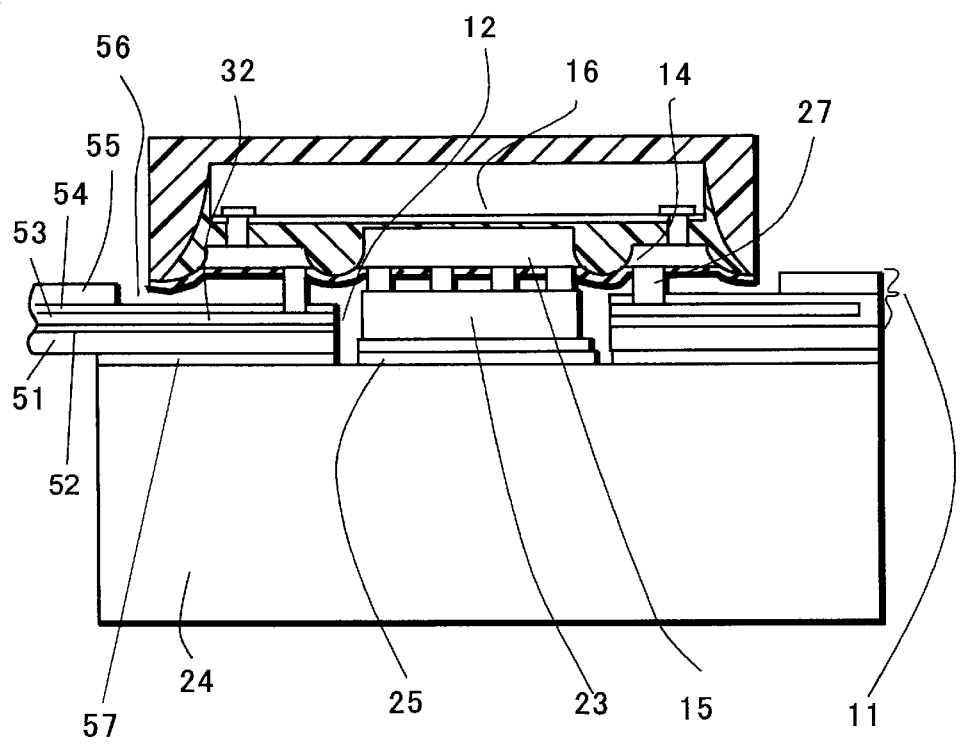
Figure 18A:
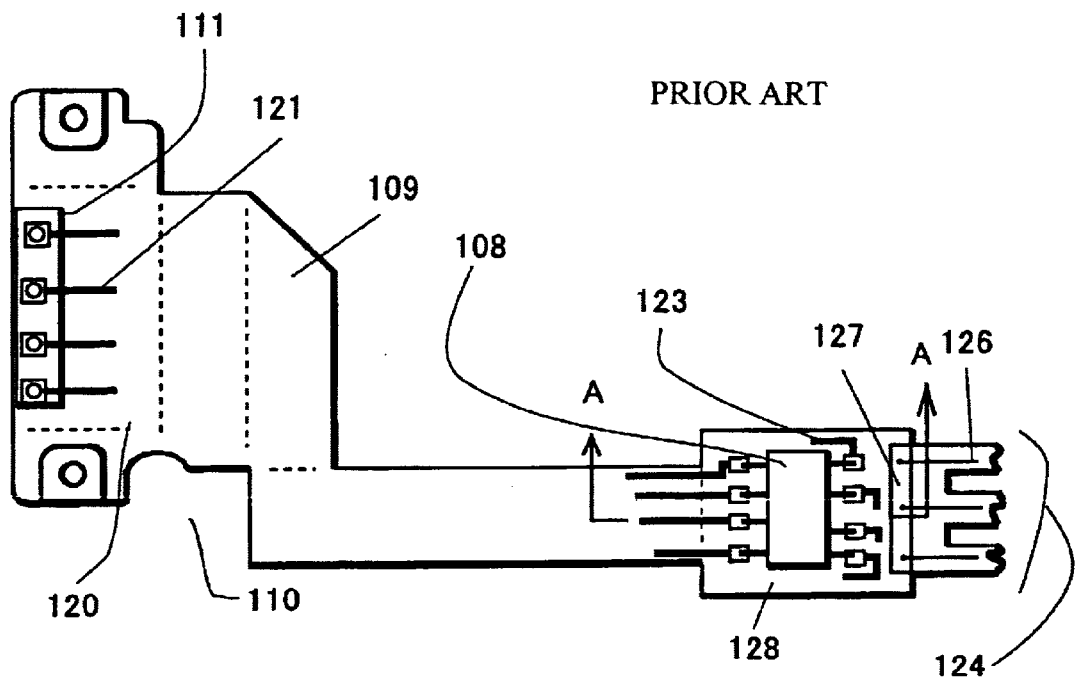
FIG. 18 is a diagram illustrating a conventional art semiconductor module used in the hard disk of FIG. 17.
Figure 18B:
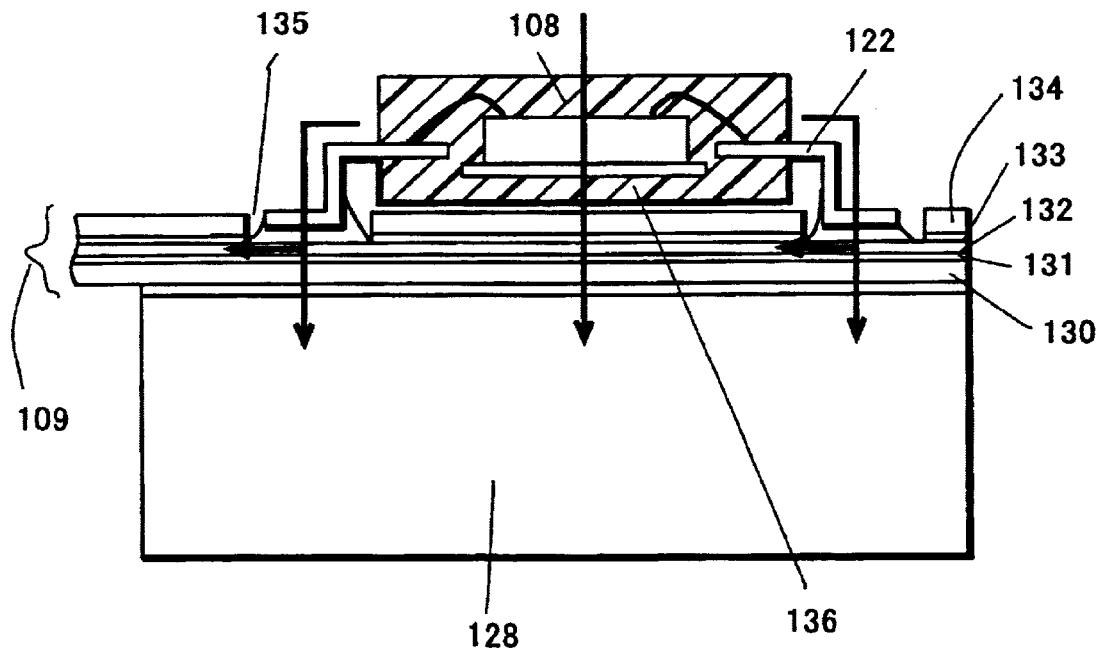

The wirings connecting between the magnetic heads 104 and the read/write amplifying IC 108 are designed to be as short as possible, so that the read/write amplifying IC 108 is disposed over the actuator 107. However, since the semiconductor device hereinafter explained is extremely thin and light-weighted, it may be mounted over the arm 105 or the suspension 106 instead of the actuator. In this case, as shown in FIG. 1B, the back surface of the semiconductor device 10 exposes from the opening 12 of the first supporting member 11, and the back surface of the semiconductor device 10 is thermally coupled with the arm 105 or the suspension 106, so that the heat from the semiconductor device 10 is externally dissipated via the arm 105 and the casing 101.

Where the read/write amplifying IC 108 is mounted on the actuator 107 as shown in FIG. 17, the circuits for reading and writing respective channels are formed on a single chip so as to allow the plurality of magnetic sensors to read and write. However, a dedicated read/write circuit may be mounted on each of the suspensions 106 for each of the magnetic heads 104 that are attached to the respective suspension 106. In this way, the wiring distance between a magnetic head 104 and a read/write amplifying IC 108 may be far shorter than that of the structure shown in FIG. 18, and such a short distance would reduce the impedance, resulting in an improved read/write rate. Since in this example, an application to a hard disk is assumed, a flexible sheet has been selected for the use as the first supporting member, however, depending on the types of the apparatus, a printed board, a ceramic substrate or a glass substrate may instead be selected as the first supporting member.

(Embodiment 2)

Figure 2A:
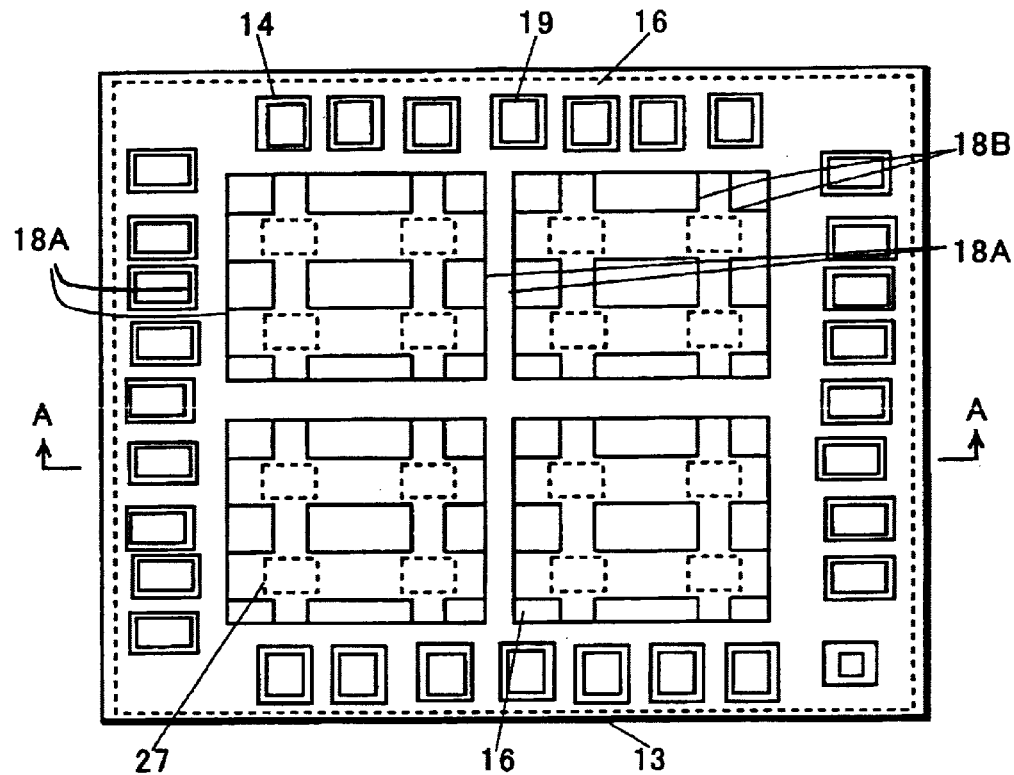
FIG. 2 is a diagram illustrating a semiconductor device according to the present invention.
Figure 2B:
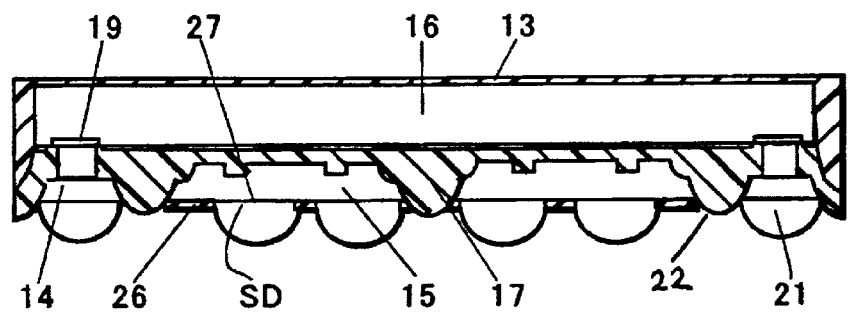
Figure 2C:
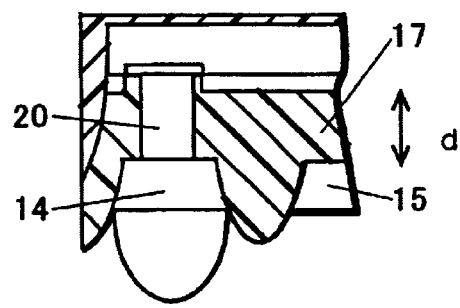

The semiconductor device according to the second embodiment of the present invention will now be explained with reference to FIG. 2. FIG. 2A is a plan view of the semiconductor device, and FIG. 2B is a cross-sectional view taken along the ling A—A. FIG. 2C is a diagram for illustrating the reason for providing the protrusive heat radiation electrode 15.

In FIG. 2, the following elements are shown as embedded within an insulating resin 13; pads 14, a heat radiation electrode 15 provided within a region surrounded by these bonding pads 14, and a semiconductor chip 16 disposed over the heat radiation electrode 15. The semiconductor chip 16 is mounted in a face-down state, and using an insulating adhesive means 17 it is affixed to the heat radiation electrode 15 which is divided into four pieces in order to achieve good adhesion. The isolation trenches formed by this division are indicated by the numeral 18A. Where the gap between the semiconductor chip 16 and the heat radiation electrode 15 is so small that the intrusion of the insulating adhesive means 17 is disturbed, then trenches 18B that are shallower than the aforementioned isolation trenches 18A may be formed on the surface of the heat radiation electrode 15.

The bonding electrodes 19 of the semiconductor chip 16 and the pads 14 are electrically connected via connections 20 made of a brazing material such as solder. Alternatively, stud bumps of Au may also be used in the place of solder.

There are other types of connecting methods for achieving these connections. For example, after bumps are provided on the respective bonding electrodes 19 of the semiconductor chip, the connections may be obtained through the application of ultrasonic wave to these bumps or through pressure welding. Also, at the peripheries of the pressure-welded bumps, solder, a conductive paste or anisotropic conductive particles may be provided. The greater details of these structures will be provided at the end of this embodiment section.

The back surfaces of the pads 14 are exposed from the insulating resin 13, and as they are, form external connection electrodes 21, and the side surfaces of the pads 14 are etched non-anisotropically. These etched portions are formed by a wet etching method, so that they have a curved structure which promotes an anchor effect.

The present structure is constituted by five elements including the semiconductor chip 16, a plurality of conductive patterns 14, the heat radiation electrode 15, the insulating adhesive means 17, and the insulating resin 13 within which all the former elements are embedded. Within a region for disposing the semiconductor chip 16, the insulating adhesive means 17 is formed over and between the pieces of the heat radiation electrode 15, especially within the isolation trenches 18 formed by etching, so that the back surface of the insulating adhesive means is exposed from the back surface of the semiconductor device 10A. All the elements including the above are molded within the insulating resin 13. The pads 14, heat radiation electrode 15 and semiconductor chip 16 are supported by the insulating resin 13 and the insulating adhesive means 17.

As for the insulating adhesive means 17, an adhesive made of an insulating material or an under fill material is preferable. Where an adhesive is employed, it may be applied to the surface of the semiconductor chip 16 in advance, and cured as the pads 14 are connected using Au bumps instead of solder 20. In the case of an under fill material 17, it may be injected into the gap after the solder 20 (or bumps) and pads 14 are connected.

As for the insulating resin, a heat-curable resin such as epoxy resin, or a thermoplastic resin such as polyimide resin or polyphenylene sulfide etc. may be used.

Any resin material can be used as the insulating resin 13 as long as it can be cured using a metal mold, or can be applied by dipping or coating. For the conductive pattern 14, a conductive foil mainly made of Cu, a conductive foil mainly made of Al or an Fe—Ni alloy, a laminate of Al—Cu, Al—Cu—Al or Cu—Al—Cu, or the like maybe used. Of course any other conductive material may also be used, and especially desirable are those conductive materials that can be etched, or that can be evaporated by laser. Where the half-etching, plating and thermal stress characteristics are concerned, a conductive material mainly made of Cu formed through rolling is suitable.

According to the present invention, the trenches 18 and 22 are also filled with the insulating resin 13 and the insulating adhesive means 17 so that slipping-out of the conductive pattern maybe prevented. Also, by performing non-anisotropic etching through a dry-etch or wet-etch method, the side surfaces of the bonding pads 14 maybe processed to have a curved structure thereby promoting the anchor effect. This realizes a structure that would not allow the conductive pattern 14 and heat radiation electrode 15 to slip out from the insulating resin 13.

Moreover, the back surface of the heat radiation electrode 15 is exposed from the back surface of the package. Therefore, the back surface of the heat radiation electrode 15 would form a structure that can be abutted or attached to the later-described metal plate 23, the second supporting member 24 or a fixation plate 25 formed on the second supporting member 24. Accordingly, this structure allows the heat generated by the semiconductor chip 16 to be dissipated into the second supporting member 24, thereby preventing the temperature rise in the semiconductor chip 16 so that the driving current and driving frequency of the semiconductor chip 16 may be increased.

In the semiconductor device 10A, since the pads 14 and the heat radiation electrode 15 are supported by the insulating resin 13, which is a mold resin, the use of any supporting substrate is unnecessitated. This structure is one feature of the present invention. The conductive paths of the conventional art semiconductor device are supported by a supporting substrate (flexible sheet, printed board or ceramic substrate), or by a lead frame, and this means that the conventional art device includes those elements that could potentially be unnecessitated. On the other hand, the device of the present invention is constituted by only essential, minimal elements, and it eliminates the need for a supporting substrate, thus it can be made thin and light-weighted, and at the same time, its cost may be reduced as it require less material cost. Accordingly, as explained in the description of the first embodiment, it may be mounted on the arms or suspensions of a hard disk.

From the back surface of the package, the pads 14 and the heat radiation electrode 15 are exposed. Where a brazing material such as solder is applied over these regions, since the area of the heat radiation electrode 15 is larger, the thickness of the applied brazing material becomes uneven. Accordingly, in order to make the film thickness of the brazing material even, an insulating film 26 is formed on the back surface of the semiconductor device 10A. The regions surrounded by dotted lines 27 shown in FIG. 2A indicate the portions of the heat radiation electrode 15 exposed from the insulating film 26, and these portions are exposed in the same manner as the exposed square-shaped portions of the back surfaces of the bonding pads 14, the individual potions of the heat radiation electrode 15 exposed from the insulating film 26 and the exposed portions of the bonding pads 14 have the same size.

Thus, the sizes of the portions wettable by the brazing material are substantially identical so that the brazing material formed thereto would have substantially the same thickness. This would not change even after a solder print or reflow process. The same is true for a conductive paste of i.e. Ag, Au or Ag—Pd etc. Given this structure, more accurate calculation can be performed to determine how much the back surface of the metal plate 23 should protrude beyond the back surfaces of the pads 14.

When the metal plate 23 and the conductive pattern 32 are designed to align within a same plane, then both the pads 14 and the heat radiation electrode 15 may be soldered at once.

The exposed portions 27 of the heat radiation electrode 15 may be formed to have a larger size than that of the exposed portions of the bonding pad in consideration with the capability to dissipate the heat from the semiconductor chip.

The provision of the insulating film 26 also allows the conductive pattern 32 provided on the first supporting member 11 to be disposed over the back surface of the semiconductor device. Generally, the conductive pattern 32 provided on the first supporting member 11 is so arranged that it bypasses the region over which the semiconductor device is attached in order to prevent short circuiting, however, the provision of the insulating film 26 allows it to be disposed without such bypassing. In addition, the insulating resin 13 and the insulating adhesive means 17 protrude beyond the conductive patterns, thereby enabling to prevent short-circuiting between solder balls SD provided on the back surface of the semiconductor device 10A.

Furthermore, the present invention is characterized in that the top surface of the heat radiation electrode 15 is made protrusive beyond the top surfaces of the pads 14.

As for a means to connect the pads 14 and the bonding electrodes 19, the use of Au bumps or solder balls may be contemplated. An Au bump may comprise at least one stage of an Au cluster, and the thickness thereof would be about 40 $\mu$m for a one-stage bump and 70–80 $\mu$m for a two-stage bump. Since the height of the heat radiation electrode 15 surface is generally designed to match with the height of the pads 14 as shown in FIG. 2C, the distance "d" between the semiconductor chip 16 and the heat radiation electrode 15 is practically determined by the thickness of the bumps. Accordingly, the above space cannot be made any smaller than the thickness of the bumps in the case of FIG. 2C, so that it is not possible to reduce the heat resistance given by this distance. However, as shown in FIG. 2, if the surface of the heat radiation electrode is made protrusive beyond the surface of the pads by a thickness substantially equal to the thickness of the bumps, this distance "d" maybe made smaller, so that the heat resistance between the semiconductor chip 16 and the heat radiation electrode 15 may be reduced.

The thickness of the solder bumps or solder balls is approximately 50 to 70 $\mu$m, and in this case also, the distance "d" may be made smaller based on the same principle. A brazing material such as solder has a good wettability with the pads, so that when it is in a molten state, it spreads out over the entire surfaces of the pads, resulting in a smaller thickness. Further, since the gap between the bonding electrodes 19 and the respective pads 14 is determined by the amount of protrusion of the heat radiation electrode 15, the thickness of the brazing material is determined by this amount of the protrusion so that the aforementioned running of solder may also be prevented. Accordingly, by the amount the brazing material can be made thicker, the stress applied to the solder may be more distributed, so that the deterioration due to heat cycles can be minimized. In addition, by adjusting this amount of protrusion, a cleaning fluid may be introduced into this gap.

This protrusive structure of the heat radiation electrode 15 is applicable to all of the embodiments of the present invention hereinafter explained.

(Embodiment 3)

Figure 3A:
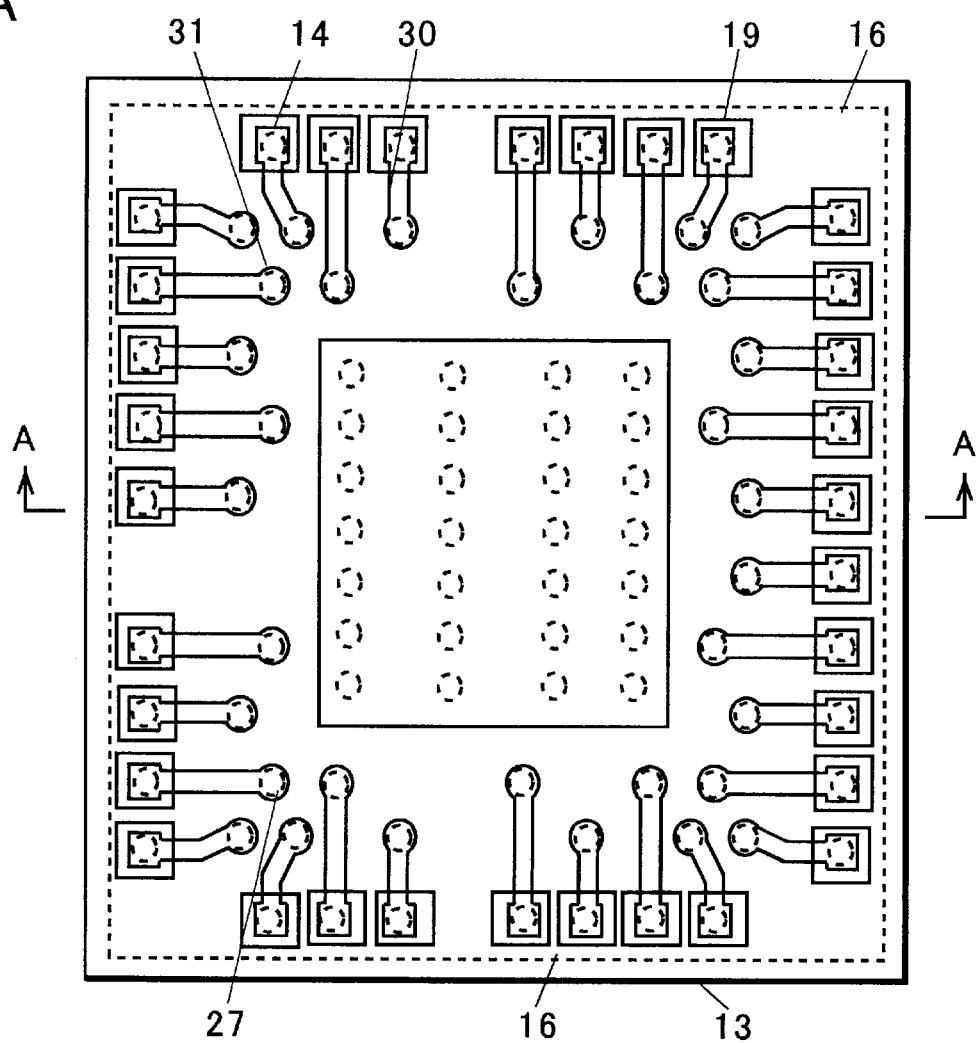
FIG. 3 is a diagram illustrating a semiconductor device according to the present invention.
Figure 3B:
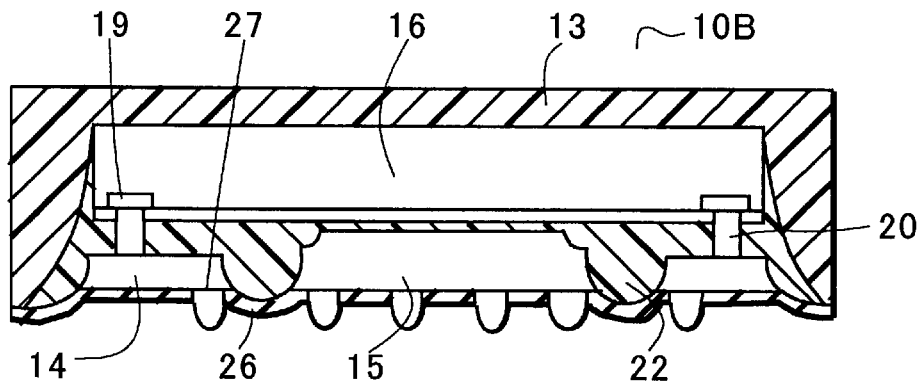

FIG. 3 shows another semiconductor device 10B according to the present invention. FIG. 3A is a plan view thereof, and FIG. 3B is a cross-sectional view taken along the line A—A. Since this structure is similar to that of FIG. 2, the following provides only the description pertinent to those features that are different from the device in FIG. 2.

In FIG. 2, the back surfaces of the pads 14 are used as the external connection electrodes as they are, however, in this embodiment, an integral wiring 30 and an external connection electrode 31 integrally formed with the wiring 30 are provided to each of the pads 14.

The rectangle shown by a dotted line represents the semiconductor chip 16, and on the back surface of the semiconductor chip 16, the external connection electrodes 31 are disposed in a ring-like arrangement as shown. This arrangement is identical or similar to that of a known BGA. In order to alleviate the distortion at the connection points, they may be formed in a wavy shape.

When the semiconductor chip 16 is disposed directly over the conductive patterns 14, 30 and 31 and the heat radiation electrode 15, the patterns and the heat radiation electrodes are short-circuited via the back surface of the semiconductor chip 16. Accordingly, the adhesive means 17 has to be an insulating material, and any conductive material must not be used.

The conductive pattern 32 on the first supporting member 1 shown in FIG. 1 is connected to the external connection electrodes 31, and the back surfaces of the pads 14 and the wirings 30 are covered by the insulating film 26. The dotted circles indicated in the regions of the external connection electrodes 31 and the heat radiation electrode 15 represent the portions that expose from the insulating film 26.

Furthermore, since the external connection electrodes 31 are provided over the back surface of the semiconductor chip 16, the heat radiation electrode 15 is designed to be smaller than the heat radiation electrode 15 of FIG. 2. Accordingly, the insulating adhesive means 17 covers the heat radiation electrode 15, external connection electrodes 31 and the wirings 30. The insulating resin 13 would then form an integral body with the insulating adhesive means 17, thus, would cover the pads 14, the wirings 30, the semiconductor chip 16 and the solder (or bump) 20.

The present embodiment has an advantage in that, even when the number of the bonding pads 14 is extremely large and their size has to be reduced, the size of the external connection electrodes 31 may be made sufficiently large by connecting them via the wirings and rearranging them as the external connection electrodes. Also, the provision of the wirings alleviates the distortion stress applied to the bonding sections. Especially, wavy wirings are effective. The present invention also provides a feature that allows the space for the thickness of the solder to be reserved by having the surface of the heat radiation electrode protrude. Accordingly, with the provision of the wirings and the design allowing the solder sections to have increased thickness, the reliability of the connections between the semiconductor chip 16 and the pads 14 may be improved.

Since the semiconductor chip 16 and the heat radiation electrode 15 are affixed together by an insulating adhesive means 17, which is an insulating material, there is a concern of thermal resistance. However, by constituting the insulating adhesive means by a silicon resin mixed with fillers such as those made of silicon oxide or aluminum oxide that contribute to thermal conduction, the heat from the semiconductor chip 16 may efficiently be conducted into the heat radiation electrode 15.

The distance between the heat radiation electrode 15 and the semiconductor chip 16 may be made even by designing the fillers to have a same diameter. Therefore, where a very small separation is desired in consideration with the thermal conduction, such a small separation may easily be formed by lightly applying a pressure to the semiconductor chip 16 while the insulating adhesive means is in a soft state. Since, in this embodiment, the use of aluminum oxide fillers having a diameter of 10 μm is assumed, the distance between the semiconductor chip 16 and the heat radiation electrode 15 is retained substantially at 10 μm.

(Embodiment 4)

The fourth embodiment explains a manufacturing method of the semiconductor devices 10A and 10B. Between the manufacturing methods of the semiconductor devices 10A and 10B, the only difference is whether it fabricates the pattern of FIG. 2 which includes only the heat radiation electrode 15 and the pads 14, or the pattern of FIG. 3 which additionally includes the wirings 30 and the external connection electrodes 31, and the rest of the manufacturing steps are substantially identical. Since either of the methods employs half-etching to form convex patterns, the explanation will be provided herein with reference to the manufacturing method of the semiconductor device 10B shown in FIG. 3. FIGS. 4 through 9 provide the cross-sectional views of FIG. 3A taken along the line A—A.

Figure 4:
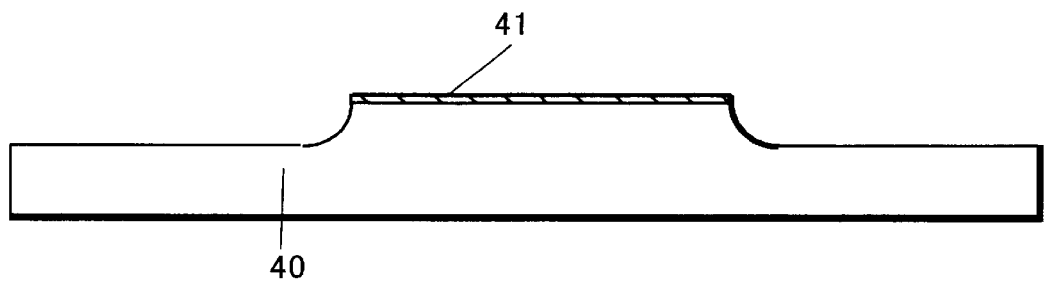
FIG. 4 is a diagram illustrating a manufacturing step of a semiconductor device according to the present invention.

First, as shown in FIG. 4, a conductive foil is provided. The thickness of the foil is desirably between 10 μm and 300 μm, and herein, a rolled copper foil in a thickness of 70 μm is used. Next, over the surface of this conductive foil 40, a conductive film 41 or a photo resist is formed as an etching mask. This pattern is identical to the pattern of the heat radiation electrode 15 of FIG. 3A.

Thereafter, the conductive foil 40 is half-etched via the conductive film 41 or the photo resist. The depth of etching should be shallower than the thickness of the conductive foil 40, and approximately equal to the substantial thickness of the solder 20 (or bumps).

By this half-etching, a convex pattern of the heat radiation electrode 15 manifests on the surface of the conductive foil 40. (FIG. 4)

Next, an etching mask PR is formed over the areas corresponding to the patterns of the pads 14, the wirings 30, the external connection electrode 31 and the heat radiation electrode 15, and again, the foil is half-etched. There are two types of formation methods for forming the portion of the etching mask corresponding to the region of the heat radiation electrode 15, one for forming PR1 and another for forming PR2, and depending on the method selected, the resultant geometry of the side surfaces of the heat radiation electrode slightly differs. Where a material having a slow etching rate such as Ni is selected as the conductive film, an overhang is formed, thus, the anchor effect can be expected.

At the layer below the etching mask, a conductive film made of Au, Ag, Pd or Ni etc. is formed over at least the locations corresponding to the pads. This film is formed in order to allow bonding.

The conductive foil 40 is then half-etched using the etching mask PR. The depth of this etching is arbitrary as long as it is shallower than the remaining thickness of the conductive foil 40. A shallower etching depth allows the formation of a finer pattern.

Figure 5:
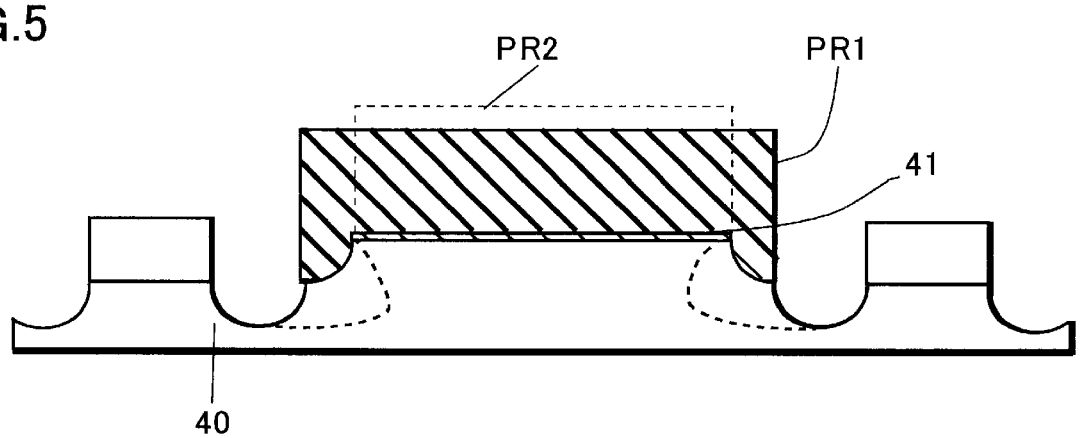
FIG. 5 is a diagram illustrating a manufacturing step of a semiconductor device according to the present invention.

By this half-etching, the convex patterns of the pads 14, the wirings 30 and the external connection electrodes 31 manifest, and the heat radiation electrode 15 that has been half-etched in the previous step manifests as being protrusive beyond the pads 14, the wiring 30 and the external connection electrodes 31. (FIG. 5)

The conductive foil 40 used herein is a Cu foil mainly made of Cu, which has been formed by rolling. This is because a rolled Cu foil is superior in flexibility. However, it may also be a conductive foil made of Al or an Fe—Ni alloy, or a laminate of Cu—Al, Al—Cu—Al or Cu—Al—Cu. The laminate of Al—Cu—Al or Cu—Al—Cu, especially, can prevent warping caused by a difference in thermal expansion coefficients.

The insulating adhesive means 17 is then applied onto the region corresponding to the rectangle indicated by a dotted line in FIG. 3. This insulating adhesive means 17 is provided in and over the isolation trench 22 between the heat radiation electrode 15 and the external connection electrodes 31, an isolation trench between the heat radiation electrode 15 and the wirings 30, and isolation trenches between wirings 30.

The semiconductor chip 16 is then affixed to the region on which the insulating adhesive means 17 has been provided, and the bonding electrodes 19 of the semiconductor chip 16 and the pads 14 are electrically connected. In the embodiment shown in the diagrams, since the semiconductor chip 16 is mounted with its face down, the solder SD1 or the bumps shown in FIG. 16 are used as the connecting means.

Herein, there is a great significance in having the surface of the heat radiation electrode 15 protrude beyond the surfaces of the pads 14 by the distance "d".

An Au bump comprises at least one stage of an Au cluster, so that the thickness of which would be 40 μm for one stage, and 70 to 80 μm for two stages. Accordingly, by having the surface of the heat radiation electrode 15 protrude beyond the surfaces of the pads 14 by the substantial thickness of the bumps, the gap "d" may be reduced.

In the case of solder bumps or solder balls, the thickness would be approximately 50 to 70 μm, and the gap may be reduced based on the same principle. Since a brazing material such as solder has a good wettability with the pads, it spreads out on the surfaces of the pads when it is in a molten state, thereby reducing its thickness. However, since the spacing between the bonding electrodes and the pads is determined by the amount of protrusion of the heat radiation electrode, the thickness of the brazing material would be determined by this amount of protrusion, so that spreading-out of solder is also restrained. Accordingly, by the extent the thickness of the brazing material can be increased, the stress applied to the solder may be more distributed, thereby suppressing the deterioration caused by heat cycles.

In this bonding process, since the pads 14 are integral with the conductive foil 40, and the back surface of the conductive foil 40 is flat, the device can be abutted to the table of the bonding machine by the plane. Accordingly, if the conductive foil 40 is perfectly fixed onto the bonding table, the pads 14 and the solder balls formed on the semiconductor chip 16 are all abutted in place, so that soldering failures would not occur. The fixation to the bonding table may be achieved by, for example, providing a plurality of vacuum holes over the entire surface of the table. There are other alternative methods for providing these connections, which will be explained at the end of this section with reference to FIG. 16.

Figure 6:
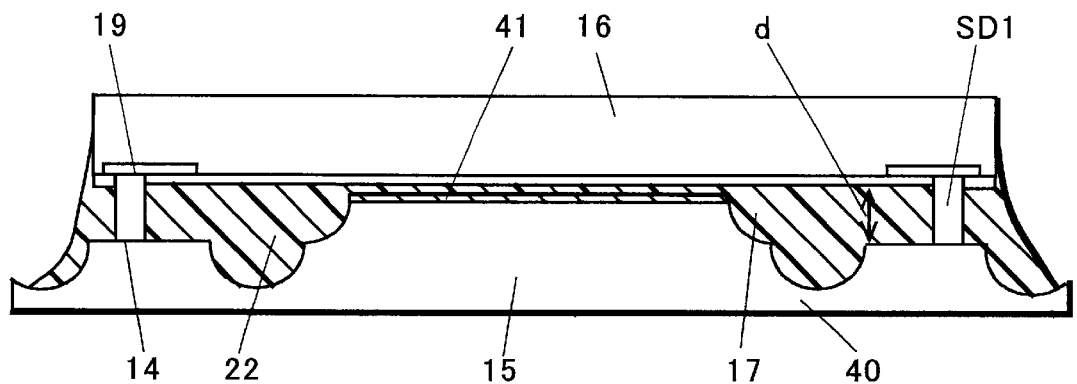
FIG. 6 is a diagram illustrating a manufacturing step of a semiconductor device according to the present invention.

The semiconductor chip may be mounted without using a supporting substrate, and the solder balls are used instead of metal thin lines, so that the semiconductor chip 16 maybe disposed at a position lower by that extent. Accordingly, the outer thickness of the package may be reduced as later explained.

Where an under fill is used as the insulating adhesive means 17, the under fill is introduced after the semiconductor chip 16 and the pads 14 are attached. (FIG. 6)

The insulating resin 13 is then formed over the entire region including the semiconductor chip 16. For the insulating resin, either a thermoplastic resin or a heat-curable resin may be used.

It maybe formed via transfer molding, injection molding, dipping or coating. For a heat-curable resin such as epoxy resin, transfer molding maybe employed, and for a thermoplastic resin such as liquid crystal polymer or polyphenylene sulfide etc., injection molding may be employed.

In the present embodiment, the thickness of the insulating resin is adjusted so that its top end comes at approximately 100 μm from the back surface of the semiconductor chip 16. This thickness may be made larger or smaller depending on the desired strength of the semiconductor device. Alternatively, the back surface of the semiconductor chip maybe exposed. In this case, radiator fins may be attached thereon, or direct external dissipation of the heat generated by the semiconductor chip may be attempted.

Since the pads 14, wirings 30, the external connection electrodes 31 and the heat radiation electrode 15 are all integral with the conductive foil 40 that is in a form of a sheet, these copper foil patterns would never be displaced during the resin injection step as long as the conductive foil 40 itself is not displaced. In addition, unlike lead frames, these conductive patterns would never generate flashes of the resin.

Figure 7:
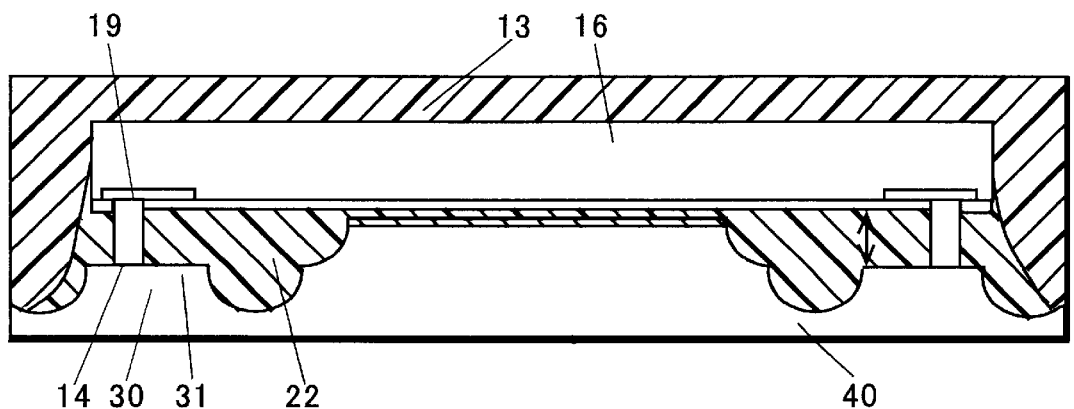
FIG. 7 is a diagram illustrating a manufacturing step of a semiconductor device according to the present invention.
Figure 8:
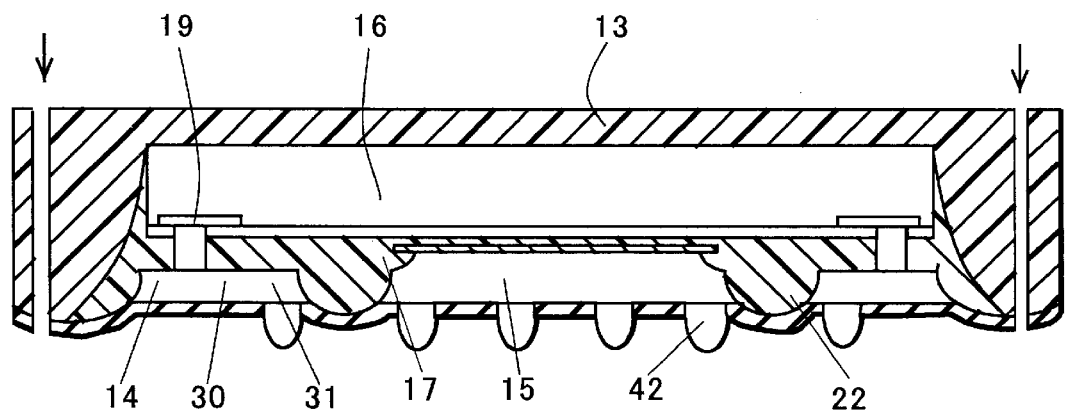
FIG. 8 is a diagram illustrating a manufacturing step of a semiconductor device according to the present invention.

As explained in the above, within the insulating resin 13, the pads 14, wirings 30, external connection electrodes 31 and the heat radiation electrode 15 that are formed as convex features are embedded along with the semiconductor chip 16, and the portion of the conductive foil 40 below its convex features is exposed from the back surface. (FIG. 7)

Thereafter, the portion of the conductive foil 40 exposed on the back surface of the insulating resin 13 is eliminated, thereby separating the pads 14, wirings 30, external electrodes 31 and heat radiation electrode 15 into individual elements.

For this separation step, various approaches may be contemplated. For example, they may be separated by etching the back surface, or by polishing or grinding, or even by the combination thereof. For example, where the grinding is performed until the insulating resin 13 is exposed, there is a risk of having residues or stretched metal particles from the ground conductive foil 40 encroach into the insulating resin 13 or the insulating adhesive means 17. Accordingly, by using an etching approach, the separation may be achieved without having the metal residues from the conductive foil 40 encroach into the surface of the insulating resin 13 or the insulating adhesive means 17 located between the Cu patterns. In this way, short-circuiting between the patterns arranged at fine intervals may be prevented.

In a case where a plurality of units, each comprising a single semiconductor device 10B, are integrally formed, a dicing step is additionally performed after this separation step.

Although a dicing apparatus is used herein to individually separate the units, it is also possible to perform this step by chocolate-bar-breaking, pressing or cutting.

According to this embodiment, after separating the Cu patterns, an insulating film 26 is formed over the patterns 14, 30, 31 and 15, and the insulating film 26 is then patterned so as to expose the portions indicated by the dotted circles shown in FIG. 3A. Thereafter, it is diced at the sections indicated by arrows into individual semiconductor devices 10B.

The solder balls 42 may be formed either before or after the dicing step.

According to the manufacturing method above, a thin and small package with a superior heat dissipation capability is fabricated, in which the bonding pads, wirings, external connection electrodes, heat radiation electrode and semiconductor chip are embedded within the insulating resin.

Figure 9:
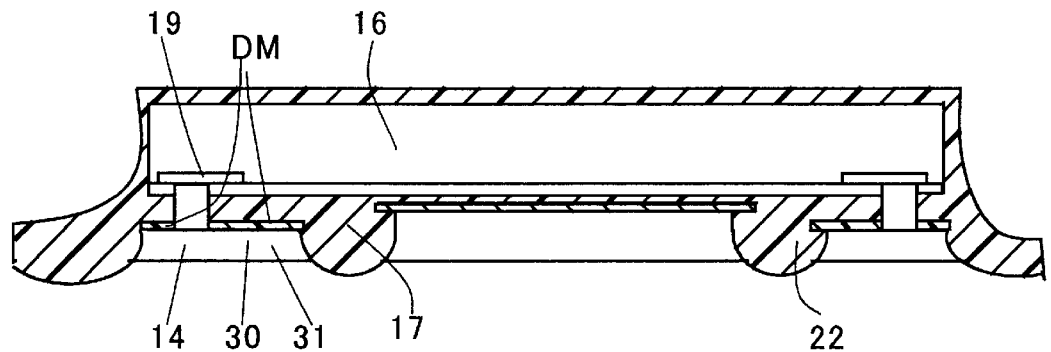
FIG. 9 is a diagram illustrating a semiconductor device of the present invention.
Figure 10:
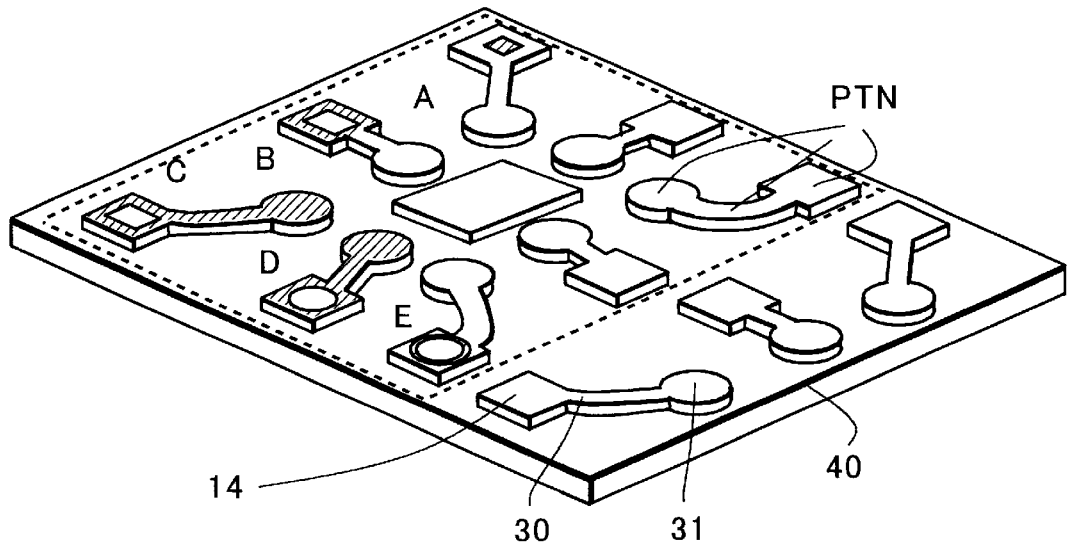
FIG. 10 is a diagram illustrating a film for preventing the running of a material, which is formed on the conductive pattern.

As shown in FIG. 9, the molding may alternatively be achieved by using the insulating adhesive means 17, without using the insulating resin 13. The patterns PTN shown in FIG. 10 represent the pads, wirings, external connection electrodes, and the hatched regions shown thereon represent formation patterns of the film for preventing solder running. This film serves to prevent solder running, and at the same time, it is applied to the other regions to improve the adhesion of the insulating adhesive means. As for alternatives, patterns A through E are illustrated, however, any other pattern may be selected. The solder-running prevention film may also be formed over the entire region other than the regions for solder connections.

The effects obtained by the above manufacturing method will now be explained.

First, since the conductive patterns are half-etched and supported integrally with the conductive foil, a substrate that has conventionally been employed for supporting is unnecessitated.

Second, since the convex conductive patterns are formed by half-etching the conductive foil, it is possible to form finer conductive patterns. Accordingly, their widths and intervals may be minimized, allowing the formation of a package having a smaller two-dimensional size.

Third, since the device may be constituted by conductive patterns, a semiconductor chip, connection means and a molding material, the structure would include only the elements that are truly essential, eliminating the excessive use of materials, thus, a thin and small semiconductor device may be realized with a substantially reduced cost.

Fourth, since the pads, wirings, external connection electrodes and heat radiation electrode are formed as convex portions through half-etching, and the separation to individual elements is performed after the molding step, tie-bars and suspension leads would not be necessary. Accordingly, the necessity for the formation of tie-bars (suspension leads), and cutting step of the tie-bars (suspension leads) are completely eliminated in the present invention.

Fifth, since the conductive foil is eliminated from the back surface of the insulating resin to separate the conductive patterns after the convex conductive patterns are embedded within the insulating resin, flashes of the resin formed between leads as those present in the conventional lead frames can be eliminated.

Sixth, since the semiconductor chip is affixed with the heat radiation electrode via the insulating adhesive means, and the head-dissipating electrode is exposed from the back surface, the heat generated by the semiconductor device can be dissipated efficiently from the surface of the semiconductor device to the heat radiation electrode. Furthermore, by mixing fillers such as those made of silicon oxide or aluminum oxide into the insulating adhesive means, the heat-dissipating capability thereof may further be improved. By uniformly designing the filler size, the spacing between the semiconductor chip 16 and the conductive patterns may be evenly retained.

(Embodiment 5)

The fifth embodiment is provided for illustrating a semiconductor device 10A, 10B to which a metal plate 23 is affixed and a semiconductor module using the same. FIG. 1 shows this type of semiconductor module (FCA) 50. The semiconductor device mounted thereto is the semiconductor device 10B shown in FIG. 3.

First, a first supporting member 11 constituted by a flexible sheet will be explained. In the present embodiment, it comprises a first PI sheet 51, a first adhesion layer 52, a conductive pattern 53, a second adhesion layer 54 and a second PI sheet 55 that are sequentially laminated from the bottom. When forming the conductive pattern in multiple layers, additional adhesion layers may be used, and upper and lower layers of the conductive pattern may be electrically connected through contact holes. Provided in this first supporting member 11 is a first opening 12 which would allow at least a metal plate 23 to be exposed as shown in FIG. 1C.

A second opening 56 is also formed in order to expose the conductive pattern. The second opening 56 may entirely expose the corresponding conductive pattern 32, or may partially expose only the portion for forming connections. For example, the second PI sheet 55 and the second adhesion layer 54 may entirely be eliminated, or, as shown in the figure, while entirely eliminating the second PI sheet, the second adhesion layer 54 may partially be eliminated only at the locations required to be exposed. According to the later manner, running of the solder 27 may be prevented.

The significance of this semiconductor device of the present invention is in that a metal plate 23 is adhered to the back surface of the heat radiation electrode 15. The significance of the semiconductor module of the present invention is in that the metal plate 23 and the back surface of the first supporting member would become substantially within the same plane.

The thickness of the metal plate 23 is determined according to the thicknesses of the first supporting member 11 and the fixation plate 25. The thicknesses are respectively determined in a manner so that the metal plate 23 exposed from the first opening 12 and the back surface of the first supporting member 11 can be substantially within a same plane when the pads 14 and the conductive pattern 32 are affixed together through the solder balls 27. Accordingly, the metal plate 23 may be abutted to the second supporting member or abutted and adhered to the fixation plate 25 provided on the second supporting member.

Several examples of this connection structure are given below.

In the first example of the structure, a light-weight metal plate such as the one made of Al or stainless steel etc., or a ceramic substrate is used as the second supporting member 24, and the metal plate 23 which has been affixed on the back surface of the semiconductor device 10 is abutted thereto. That is, in this structure, the abutment to the second supporting member 24 is provided without the use of the fixation plate 25. The fixation between the heat radiation electrode 15 and the metal plate 23, and between the metal plate 23 and the second supporting member 24 is achieved by a brazing material such as solder etc. or an insulating adhesive means containing fillers having a superior thermal conductivity.

In the second example, the structure employs a light-weight metal plate such as the one made of Al or stainless steel etc. or a ceramic substrate as for the second supporting member 24, and a fixation plate 25 is formed thereon, and this fixation plate 25 and the metal plate 23 is affixed together.

Where an Al plate is used as the second supporting member 24 for example, the fixation plate 25 is preferably the one made of Cu. This is because Cu can be plated over Al. This may be formed in a thickness of, up to about 10 μm. In addition, since it is a plated film, it may be formed in intimate contact with the second supporting member 24, making the thermal resistance between the fixation plate 25 and the second supporting member 24 extremely small. Alternatively, a conductive past may be applied to form the fixation plate 25.

The Cu fixation plate 25 and the Al substrate may instead be adhered using an adhesive, however, in this case the thermal resistance would become larger.

Where a ceramic substrate is used as the second supporting member 24, the fixation plate 25 is formed on an electrode formed by print-baking a conductive paste.

The second supporting member 24 and the first supporting member 11 are adhered together via a third adhesion layer 57.

For instance;

First PI sheet 51: 25 μm

Second PI sheet 55: 25 μm

First through third adhesion layers 52, 54, 57: 25 μm after being baked (an acrylic adhesive is used)

Solder balls 27: 50 μm;

Conductive pattern 53: 25 μm

Fixation plate 25: approximately 25 μm.

Where the thicknesses of the respective films are adjusted in this way, then after affixing the semiconductor device onto the first supporting member 11, the second supporting member 24 having the fixation plated 25 formed thereon would be readily adhered.

Where a module is provided, in which the second supporting member 24 is attached to the first supporting member 11, and the semiconductor device 10 is placed within an opening 56 provided in this module and then soldered, the soldering may be performed at once without promoting connection failures.

Accordingly, the heat generated by the semiconductor chip 16 may be dissipated into the second supporting member 24 via the heat-dissipating plate 15, metal plate 23 and fixation plate. Moreover, since it provides a substantial reduction in the thermal resistance compared to that of the conventional art structure (FIG. 18B), the driving current and the driving frequency of the semiconductor chip 16 can be maximized. The back surface of this second supporting member 24 may be attached to the actuator 107, bottom of the casing 101 or the arm 105 shown in FIG. 17. Therefore, the heat from the semiconductor chip can ultimately be emitted to the outside via the casing 101. Accordingly, even if the semiconductor module is mounted within the hard disk 100, the temperature of the semiconductor chip itself is kept relatively low, so that the read/write speed of the hard disk 100 can be further accelerated. This FCA may be mounted on an apparatus other than a hard disk. In this case, the second supporting member should be abutted to a member of the apparatus having a small thermal resistance. Where it is mounted in any other apparatus, a printed board or a ceramic substrate may also be used instead of the flexible sheet.

(Embodiment 6)

Figure 11:
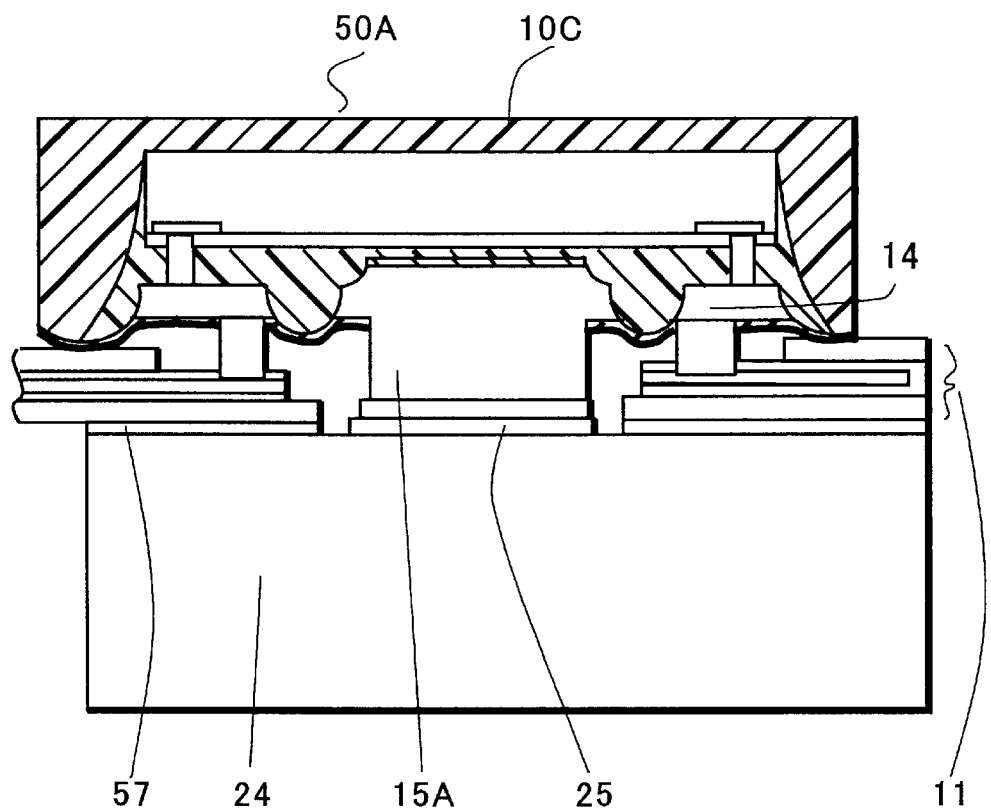
FIG. 11 is a diagram illustrating a semiconductor module of the present invention.

The sixth embodiment is provided to illustrate a semiconductor device 10C in which the heat radiation electrode 15 is made protrusive to substitute the metal plate, and a semiconductor module 50A using the same. FIG. 11 shows a structure in which the heat radiation electrode 15A protrudes beyond the top surfaces and the back surfaces of the pads 14 as if the heat radiation electrode 15 and the metal plate 23 are constituted by an integral element.

First, the manufacturing method thereof will be explained with reference to FIGS. 12 through 14. Its manufacturing steps corresponding to the steps illustrated in FIGS. 4 through 8 are identical and the descriptions for these steps would not be repeated.

Figure 12:
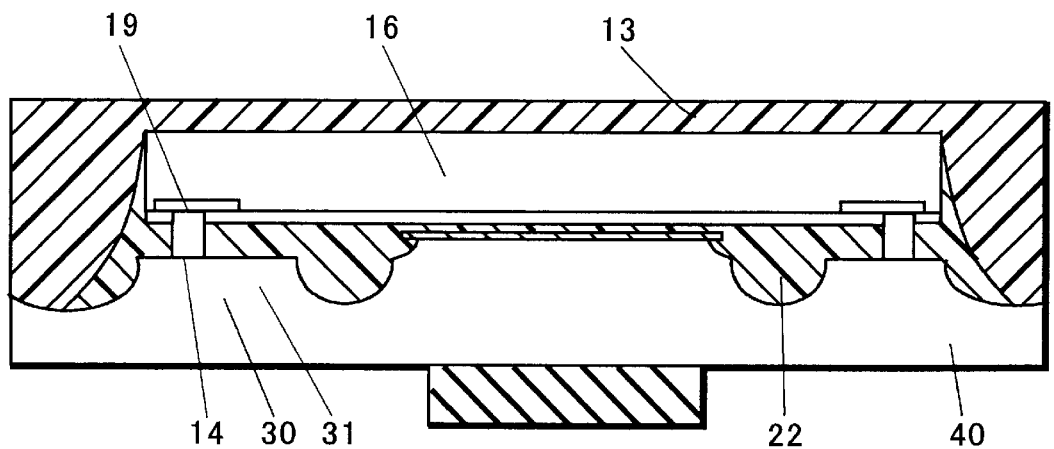
FIG. 12 is a diagram illustrating a manufacturing step of a semiconductor device according to the present invention.
Figure 13:
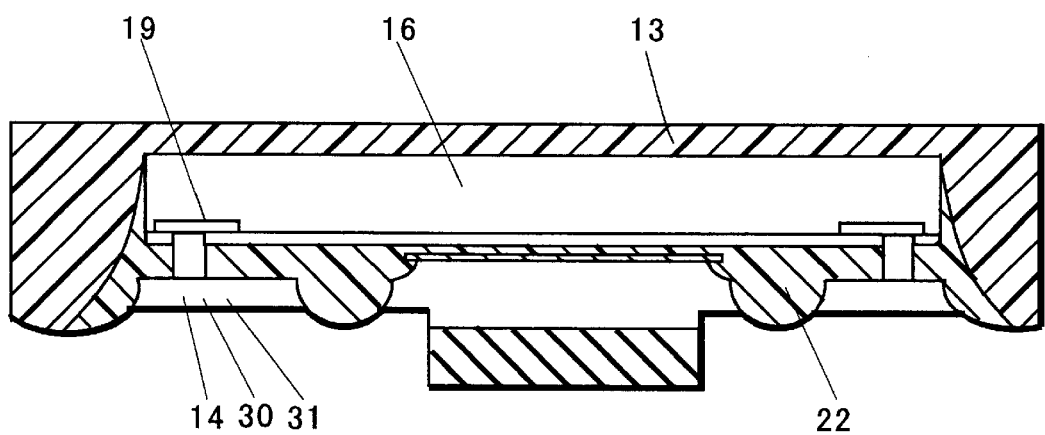
FIG. 13 is a diagram illustrating a manufacturing step of the semiconductor device according to the present invention.

FIG. 12 is showing the conductive foil 40 being covered by the insulating resin 13, and on the portion corresponding to the heat radiation electrode 15, a photo resist PR is formed. When this conductive foil 40 is etched via the photo resist PR, the resultant heat radiation electrode 15A would have a structure which protrudes beyond the back surfaces of the pads 14. Alternatively, a conductive film made of Ag or Au etc. may be selectively formed and used as a mask instead of the photoresist PR. This film would function also as an anti-oxidizing film.

In the structure such as the one shown in FIG. 1 in which the metal plate 23 is adhered, since the metal plate 23 is extremely thin (i.e. 125 $\mu$m), the workability is extremely poor. On the other hand, where the heat radiation electrode 15A is etched to have the protrusive structure, the attaching step of the metal plate 23 may be eliminated.

Figure 14A:
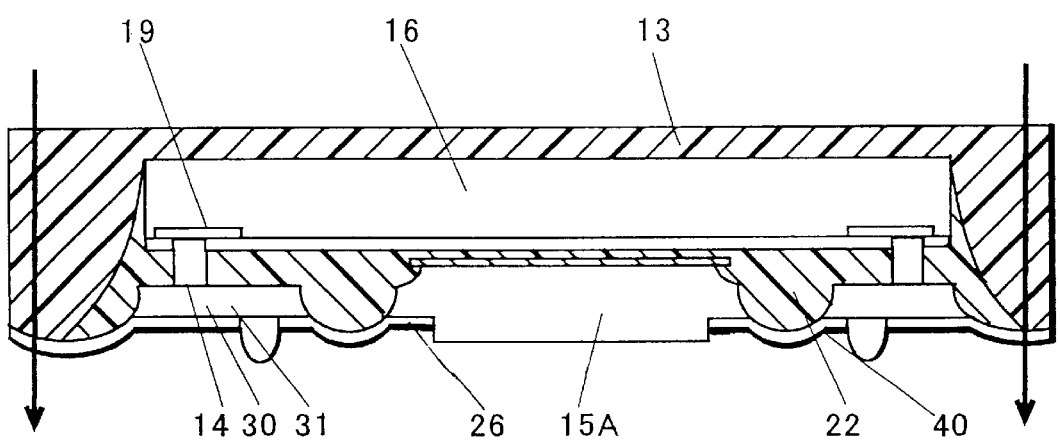
FIG. 14 is a diagram illustrating a manufacturing step of the semiconductor device according to the present invention.

Next, as shown in FIG. 14, after the pads 14, wirings 30 and external connection electrodes 31 are completely separated, the insulating film 26 is formed, and the portions for providing solder balls are exposed. After it is affixed via the solder balls 42, it is diced at the sections indicated by arrows.

The isolated semiconductor device is then mounted on the first supporting member 11 as shown in FIG. 11. Thereafter, the second supporting member 24 is attached thereto as previously mentioned. At this point, since the heat radiation electrode 15A is protrusive, it can be readily connected to the fixation plate 25 via soldering etc.

Figure 14B:
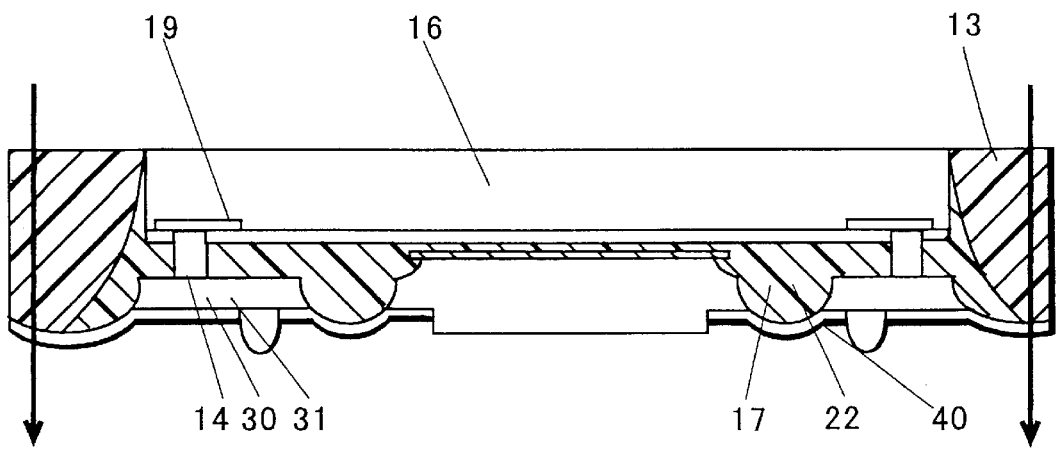

Shown in FIG. 14B is a structure in which the back surface of the semiconductor chip 16 is exposed from the insulating resin. For example, by performing the molding step while abutting the back surface of the semiconductor chip to the top mold, then the molded structure such as the one shown may be obtained.

(Embodiment 7)

Figure 15A:
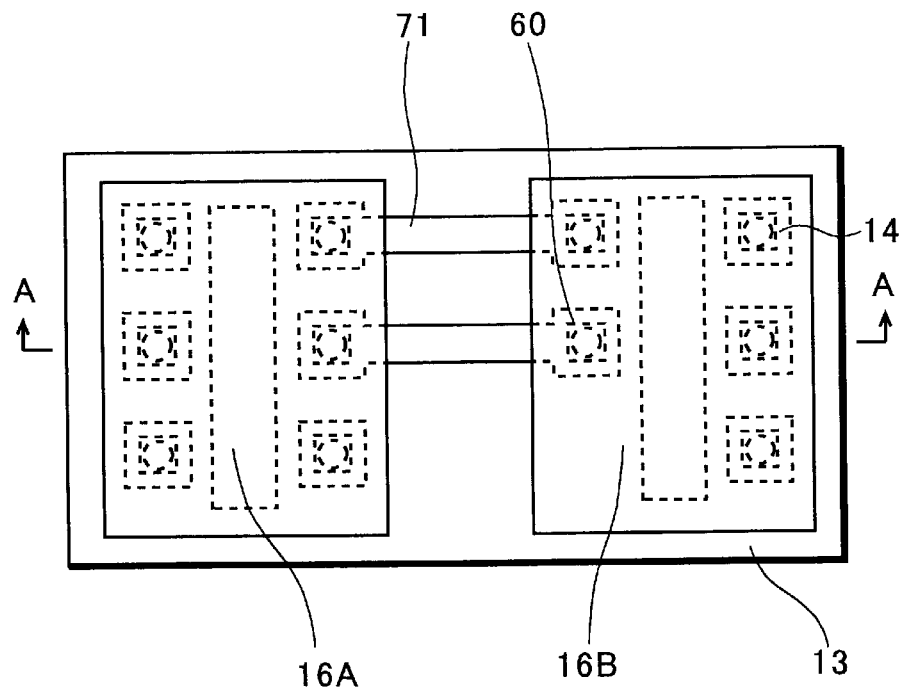
FIG. 15 is a diagram illustrating a semiconductor device according to the present invention.
Figure 15B:
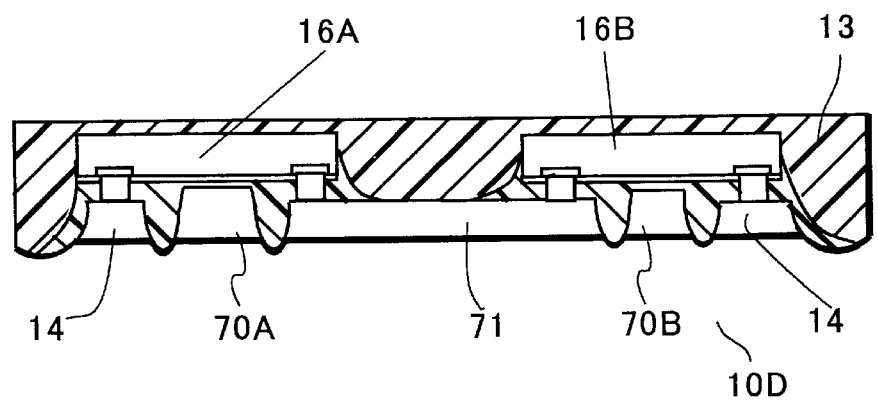

The seventh embodiment is provided to illustrate another semiconductor device. FIG. 15A shows a plan view of the semiconductor device according to the present invention, and FIG. 15B shows a cross-sectional view of FIG. 15A taken along the line A—A.

According to the present invention, a first heat radiation electrode 70A and a second heat radiation electrode 70B are disposed substantially in a same plane, and along the peripheries thereof, pads 14 are arranged. The back surfaces of these pads 14 themselves serve as the external connection electrodes, however, the re-arranged type of wirings shown in FIG. 3 may instead be employed. Between the chips, at least one bridge 71 is disposed. At the both ends of the bridges 71, pads 14 are integrally formed, and these pads 14 too are connected to the bonding electrodes 19.

Over the first heat radiation electrode 70A which protrudes upwardly, a first semiconductor chip 16A is affixed, and over the second heat radiation electrode 70B which similarly protrudes upwardly, a second semiconductor chip 16B is affixed, and they are connected via solder.

As apparent from the above explanation, by half-etching the conductive foil, and performing the molding of the insulating resin 13 before the foil is completely separated, the risk of having the bridges 71 fall down or slip out may be eliminated.

As in the present embodiment, a plurality of chips may be packaged into a single package.

The embodiments described here to fore are provided in order to illustrate the structures designed in consideration with the heat-dissipating capability of a single read/write amplifying IC. However, where the applications to various types of apparatus are contemplated, there may be a case in which the heat-dissipating capability of a plurality of semiconductor chips must be considered. Of course, it is possible to package them into separate, individual packages, however, the plurality of the semiconductor chips may also be packaged into one package as illustrated in FIG. 15.

The metal plates may of course be provided in either the structure in which they are attached to the heat radiation electrodes as shown in FIG. 1 or the structure in which the heat radiation electrodes themselves are designed to have the protrusive structure as shown in FIG. 11. These devices may be mounted on a flexible sheet or a flexible sheet having the second supporting member attached thereon.

FIG. 16 shows a series of diagrams for illustrating several methods that are applicable to any of the embodiments for providing connection between bumps B formed on the semiconductor chip 16 and the pads 14. P represents a plated film made of Au, Ag or the like formed if necessary.

FIG. 16A illustrates an ACP (anisotropic conductive paste/film) method in which the electrical conduction is achieved by providing conductive particles between the bump B and the pad 14 (or plated film P), and applying pressure.

FIG. 16B illustrates an SBB (stand bump bonding) method in which, as the bump B and the pad 14 (or plated film) are connected, conductive paste CP is simultaneously provided at the periphery.

FIG. 16C illustrates an ESC (epoxy encapsulated solder connection) method in which, as the bump B is pressure-welded, molten solder SD is simultaneously provided at the periphery.

FIG. 16D illustrates an NCP (non-conductive paste) method in which an insulating adhesive means is provided around the bump B which has been pressure-welded to achieve electrical conduction.

FIG. 16E illustrates a GGI (gold—gold interconnection) method in which an Au bump and a plated Au film P are connected by ultrasonic wave.

FIG. 16F illustrates a solder bump method in which the connection is achieved through soldering, and an insulating adhesive means or an under fill is introduced into the gap. The disclosure herein employs this method.

The embodiments described above are explained with a flexible sheet as a substrate, however, a ceramic substrate, a printed board, a flexible sheet, a metal substrate or a glass substrate etc. can also be applied to the substrate of the present invention.

As listed above, there are a variety of connecting methods available, however, in consideration with the connection strength, a method should be selected from the above. A structure such as the one from the above may also be used for the connections between the back surfaces of the external connection electrodes and the first supporting member 11.

As apparent from the above description, according to the present invention, the distance between the semiconductor chip and the heat radiation electrode may be made smaller by having the surface of the heat radiation electrode protrude beyond the surfaces of the pads. Especially, the distance between the bonding electrodes and the pads is determined by the protruding amount of the heat radiation electrode, so that the thickness of the brazing material is determined by this protruding amount. Accordingly, by the amount the thickness of the brazing material can be increased, the stress applied to the solder can be more distributed, thereby enabling to suppress the deterioration by heat cycles.

The present invention also provides an advantage in that the mounting of the device on an FCA can be facilitated by providing the semiconductor device in which the metal plate protrudes beyond the back surfaces of the external connection electrodes or the pads by affixing a metal plate to a heat radiation electrode exposed from the back surface of the package.

Especially, by providing an opening to the FCA so as to allow the back surface of the FCA and the heat radiation electrode of the semiconductor device to be within a same plane, the abutment to the second supporting member can be readily achieved.

By using Al as for the second supporting member material and by forming thereon a fixation plate made of Cu, and affixing the heat radiation electrode or the metal plate to this fixation plate, the heat generated by the semiconductor chip may be externally dissipated via the second supporting member.

Accordingly, the temperature rise of the semiconductor chip may be prevented, allowing the device to operate at a higher performance level close to its inherent capability. Especially, such an FCA used in a hard disk is capable of providing efficient external emission of heat so that the read/write speed of the hard disk may be increased.

What is claimed is:

1. A semiconductor device comprising:
   a semiconductor chip integrally molded by an insulating resin in a face-down state;
   a pad electrically connected to a bonding electrode of the semiconductor chip and provided to expose from the insulating resin;
   a heat radiation electrode disposed on the surface of the semiconductor chip and provided to expose from the insulating resin; and
   a connecting means which connects the bonding electrode and the pad,
   wherein the top surface of the heat radiation electrode protrudes beyond the top surface of the pad, and by the amount of the protrusion, the thickness of the connecting means is practically determined.

2. A semiconductor device as claimed in claim 1, wherein the connecting means is a bump made of a brazing material such as Au or solder, or a solder ball.

3. A semiconductor device as claimed in claim 1, further comprising a metal plate disposed on the exposed portion of the heat radiation electrode to protrudes beyond the back surface of the pad.

4. A semiconductor device as claimed in claim 1, wherein the back surface of the pad and the back surface of the heat radiation electrode are disposed substantially within a same plane.

5. A semiconductor device as claimed in claim 1, wherein the semiconductor chip and the heat radiation electrode are affixed together by an insulating material.

6. A semiconductor device as claimed in claim 1, wherein the heat radiation electrode and the metal plate are affixed together by an insulating material or a conductive material.

7. A semiconductor device as claimed in claim 3, wherein the heat radiation electrode and the metal plate are integrally formed from a same material.

8. A semiconductor device as claimed in claim 1, wherein the back surface of the insulating resin protrudes beyond the back surface of the pad.

9. A semiconductor device as claimed in claim 8, wherein the side surfaces of the pad and the back surface of the insulating resin which extends from the side surfaces of the pad define a same curved surface.

10. A semiconductor module comprising:
    a first supporting member provided a conductive pattern;
    a semiconductor device including:
        a semiconductor chip electrically connected to the conductive pattern and integrally molded by an insulating resin in a face-down state;
        a pad electrically connected to a bonding electrode of the semiconductor chip and the conductive pattern, and provided to expose from the insulating resin;
        a heat radiation electrode disposed on the surface of the semiconductor chip and provided to expose from the insulating resin;
    a connecting means which connects the bonding electrode and the pad;
    an opening portion provided in the first supporting member at a location corresponding to the heat radiation electrode; and
    a metal plate affixed to the heat radiation electrode in the opening portion,
    wherein the top surface of the heat radiation electrode protrudes beyond the top surface of the pad, and by the amount of this protrusion, the thickness of the connecting means is practically determined.

11. A semiconductor module as claimed in claim 10, further comprising a second supporting member affixed to the metal plate and adhered onto the back surface of the first supporting member, wherein the metal plate and the heat radiation electrode are affixed together.

12. A semiconductor module as claimed in claim 10, wherein the heat radiation electrode and the metal plate are formed integrally from a same material.

13. A semiconductor module as claimed in claim 11, further comprising a fixation plate made of a conductive material provided on the second supporting member at a location corresponding to the metal plate, wherein the fixation plate and the metal plate are thermally coupled.

14. A semiconductor module as claimed in claim 13, wherein the metal plate is mainly made of Cu, the second supporting member is mainly made of Al, and the fixation plate is constituted by a plated film mainly made of Cu which is formed on the second supporting member.

15. A semiconductor module as claimed in, claim 10, wherein the back surface of the insulating resin protrudes beyond the back surface of the pad.

16. A semiconductor module as claimed in claim 15, wherein the side surfaces of the pad and the back surface of the insulating resin which extends from the side surfaces of the pad define a same curved surface.

17. A semiconductor module as claimed in claim 10, wherein the semiconductor chip is a read/write amplifying IC for a hard disk.

18. A semiconductor device comprising:

a semiconductor chip integrally molded by an insulating resin in a face-down state;

a pad electrically connected to a bonding electrode of the semiconductor chip;

an external connection electrode extending via a wiring integral to the pad and provided to expose from the insulating resin;

a heat radiation electrode disposed on the surface of the semiconductor chip; and a connecting means which connects the bonding electrode and the pad, wherein the top surface of the heat radiation electrode protrudes beyond the top surface of the pad, and by the amount of this protrusion, the thickness of the connecting means is practically determined.

19. A semiconductor device as claimed in claim 18, wherein the connecting means is a bump made of Au or a brazing material such as solder, or a solder ball.

20. A semiconductor device as claimed in claim 18, further comprising a metal plate disposed on the exposed portion of the heat radiation electrode to protrude beyond the back surface of the external connection electrode.

21. A semiconductor device as claimed in claim 18, wherein the back surface of the external connection electrode and the back surface of the heat radiation electrode are disposed substantially within a same plane.

22. A semiconductor device as claimed in claim 18, wherein the semiconductor chip and the heat radiation electrode are affixed together using an insulating material.

23. A semiconductor device as claimed in claim 20, wherein the heat radiation electrode and the metal plate are affixed together using an insulating material or a conductive material.

24. A semiconductor device as claimed in claim 20, wherein the heat radiation electrode and the metal plate are formed integrally from a same material.

25. A semiconductor device as claimed in claim 18, wherein the back surface of the insulating resin protrudes beyond the back surface of the external connection electrode.

26. A semiconductor device as claimed in claim 25, wherein the side surfaces of the external connection electrode and the back surface of the insulating material extending from the side surfaces of the external connection electrode define a same curved surface.

27. A semiconductor module comprising:

a first supporting member having a conductive pattern;

a semiconductor device including:

a semiconductor chip electrically connected to the conductive pattern and integrally molded by an insulating resin in a face-down state;

a pad electrically connected to a bonding electrode of the semiconductor chip;

an external connection electrode provided via a wiring integral to the pad and the conductive pattern, and provided to expose from the insulating resin;

a heat radiation electrode disposed on the surface of the semiconductor chip and provided to expose from the insulating resin;

a connecting means which connects the bonding electrode and the pad;

an opening portion provided in the first supporting member at a location corresponding to the heat radiation electrode; and a metal plate affixed to the heat radiation electrode in the opening portion, wherein the top surface of the heat radiation electrode protrudes beyond the top surface of the pad, and by the amount of this protrusion, the thickness of the connecting means is practically determined.

28. A semiconductor module as claimed in claim 27, further comprising a second supporting member affixed to the metal plate and adhered onto the back surface of the first supporting member.

29. A semiconductor module as claimed in claim 27, wherein the heat radiation electrode and the metal plate are formed integrally from a same material.

30. A semiconductor module as claimed in claim 28, further comprising a fixation plate made of a conductive material and provided on the second supporting member at a location corresponding to the metal plate, wherein the fixation plate and the metal plate are thermally coupled.

31. A semiconductor module as claimed in claim 30, wherein the metal plate is mainly made of Cu, the second supporting member is mainly made of Al, and the fixation plate is constituted by a plated film mainly made of Cu formed on the second supporting member.

32. A semiconductor module as claimed in claim 27, wherein the back surface of the insulating adhesive means protrudes beyond the back surface of the external connection electrode.

33. A semiconductor module as claimed in claim 32, wherein the side surfaces of the external connection electrode and the back surface of the insulating adhesive means adhered to the external connection electrode define a same curved surface.

34. A semiconductor module as claimed in claim 27, wherein the semiconductor chip is a read/write amplifying IC for a hard disk.

* * * * *